(12) United States Patent
Usui et al.

(10) Patent No.: US 6,836,940 B2
(45) Date of Patent: Jan. 4, 2005

(54) PROCESS FOR PRODUCING A LAMINATED INK-JET RECORDING HEAD

(75) Inventors: Minoru Usui, Nagano (JP); Masato Shimada, Nagano (JP); Masami Murai, Nagano (JP); Kouji Sumi, Nagano (JP); Tsutomu Nishiwaki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 262 days.

(21) Appl. No.: 09/974,441

(22) Filed: Oct. 11, 2001

(65) Prior Publication Data

US 2002/0018105 A1 Feb. 14, 2002

Related U.S. Application Data

(62) Division of application No. 09/286,456, filed on Apr. 6, 1999, now Pat. No. 6,332,254, which is a division of application No. 08/809,069, filed on May 14, 1997, now Pat. No. 6,158,847.

(30) Foreign Application Priority Data

Jul. 14, 1995 (JP) .............................................. 7-201540
Mar. 29, 1996 (JP) .............................................. 8-77669

(51) Int. Cl.$^7$ ............................. B21D 53/76; B05D 5/04
(52) U.S. Cl. ....................... 29/25.35; 29/890.1; 29/846; 427/100
(58) Field of Search ............................ 29/25.35, 890.1, 29/846, 831; 347/68, 70, 71; 427/100

(56) References Cited

U.S. PATENT DOCUMENTS

| | | | |
|---|---|---|---|
| 4,368,252 A | * 1/1983 | Kakuhashi et al. | ........ 29/846 X |
| 4,730,196 A | 3/1988 | Van Esdonk et al. | ......... 347/71 |
| 4,737,447 A | 4/1988 | Suzuki et al. | ............... 430/321 |
| 4,937,597 A | 6/1990 | Yasuhara et al. | ............. 347/71 |
| 5,003,516 A | 3/1991 | Sato et al. | .................. 29/25.35 |
| 5,013,396 A | 5/1991 | Wise et al. | ................. 29/25.35 |
| 5,265,315 A | 11/1993 | Hoisington et al. | ........... 347/71 |
| 5,266,964 A | 11/1993 | Takahashi et al. | ......... 29/25.35 |
| 5,403,701 A | 4/1995 | Lum et al. | .................. 430/315 |
| 5,475,279 A | 12/1995 | Takeuchi et al. | .............. 347/71 |
| 5,500,988 A | 3/1996 | Moynihan et al. | ......... 29/890.1 |

FOREIGN PATENT DOCUMENTS

| | | | |
|---|---|---|---|
| EP | 584523 | 3/1994 | |
| EP | 709200 | 5/1996 | |
| JP | 2-205096 | * 8/1990 | .................. 29/846 |
| JP | 5-136476 | 6/1993 | |
| JP | 5-504740 | 7/1993 | |
| JP | 5-254133 | 10/1993 | ................ 29/890.1 |
| JP | 6-314821 | 11/1994 | |
| JP | 8-104004 | * 4/1996 | |
| JP | 6-206787 | 7/2001 | |
| WO | WO 93/22140 | 11/1993 | |

OTHER PUBLICATIONS

Kurosawa et al, "A Cylindrical Ultrasonic Micro Motor Based on PZT Thin Film", IEEE Transaction on Ultrasonics Symposium, vol. 1, Nov. 1994, pp. 549–552.*
Patent Abstracts of Japan, vol. 095, No. 002, Mar. 31, 1995, & JP 06 305142 Seiko Epson Corporation Nov. 1, 1994, ABSTRACT.
Patent Abstracts of Japan, vol. 015, No. 407 (M–1169), Oct. 17, 1991; & JP 03 169559 Seiko Epson Corporation Jul. 23, 1991 ABSTRACT.
Patent Abstracts of Japan, vol. 016 No. 217 (M–1252), May 21, 1992; & JP 04 041248 A Seiko Epson Corporation Feb. 12, 1992 ABSTRACT.
Patent Abstracts of Japan, vol. 095, No. 004, May 31, 1995, & JP 07 014479 A Seiko Epson Corporation, Jan. 17, 1995, ABSTRACT.
Miller et al. Hydrothermal Synthesis of Modified Lead Titanate Powders, Applications of Ferroelectrics, 1992, ISAF'92, Processing of the Eigth IEEE International Symposium, pp. 59–62.
Silvestrova et al, New Piezoelectric Materials, Frequency Control Symposium, 47$^{th}$ Processings of the IEEE International, pp. 351–352.

* cited by examiner

Primary Examiner—A. Dexter Tugbang
(74) Attorney, Agent, or Firm—Sughrue Mion, PLLC

(57) ABSTRACT

A process for producing a laminated ink-jet recording head including the steps of forming a titanium layer across a surface of a diaphragm, and forming a layer of a piezoelectric material on the titanium layer by a hydrothermal method.

11 Claims, 18 Drawing Sheets

PROCESS FOR PRODUCING A LAMINATED INK-JET RECORDING HEAD

This is a divisional of application Ser. No. 09/286,456 filed Apr. 6, 1999, now U.S. Pat. No. 6,332,254 which is a divisional of application Ser. No. 08/809,069 filed May 14, 1997, and issued on Mar. 13, 2001 as U.S. Pat. No. 6,158,847, the disclosures of which are incorporated herein by reference.

TECHNICAL FIELD

This invention relates to a laminated ink-jet recording head, a process for making the head and an apparatus such as a printer having the recording head; in particular, the invention relates to a laminated ink-jet recording head or the like that comprise a nozzle plate, pressure generating members and a diaphragm in superposition and which have piezoelectric vibrators of a flexural vibrating mode mounted on a surface of the diaphragm.

BACKGROUND ART

Laminated ink-jet recording heads have heretofore been known that comprise a nozzle plate, pressure generating compartments and a diaphragm in superposition and which have piezoelectric vibrators of a flexural vibrating mode mounted on a surface of the diaphragm (for example, Unexamined Published, Japanese Patent Application (kohyo) No. Hei 5-504740). Typically, most of the members that constitute the laminated ink-jet recording head are formed of ceramics. Hence, by sintering the aforementioned members in the form of superposed green sheets (claey sheets), those members can be fixed without using an adhesive. The resulting advantage of this feature is that the step of joining the individual layers together can be eliminated to thereby simplify the manufacturing process.

However, with the aforementioned conventional art laminated ink-jet recording head, two operations are necessary, one for superposing the green sheets of the respective members and the other for sintering them. It should here be noted that since the aforementioned respective members are made of ceramics comprising different ingredients, the diaphragm and the piezoelectric vibrator that have different coefficients of thermal expansion are superposed and sintered. Hence, due to the thermal expansion mismatch between the two members, deformation may occur after sintering or warpage and the like may prevent complete joining of the two members.

Under the circumstances, the present inventors conducted intensive studies and obtained a novel finding in that the above-mentioned problems could advantageously be solved by producing piezoelectric vibrating elements utilizing a hydrothermal method (hereunder sometimes referred to as a "hydrothermal synthesis method"). This hydrothermal method has heretofore been generally known since it has been proposed by, for example, Unexamined Published Japanese Patent Application (kokai) Nos. Hei 5-136476, Hei 6-206787, and Hei 6-314821; however, neither of these patents give consideration to the utilization of the hydrothermal method in the manufacture of laminated ink-jet recording heads.

DISCLOSURE OF INVENTION

An object of the present invention is to provide a laminated ink-jet recording head that has a strong joint between the diaphragm and the piezoelectric vibrating element and which can be driven on low voltage. Another object of the invention is to provide a process for producing the laminated ink-jet recording head. Yet another object of the invention is to provide an apparatus such as a printer that is equipped with the recording head.

In order to attain these objects, the present invention provides a laminated ink-jet recording head including a spacer in which a pressure generating chamber is formed, a diaphragm that closes one side of the pressure generating chamber and which has a piezoelectric vibrating element of a flexural vibrating mode secured to the surface, and a nozzle plate that closes the other side of the pressure generating chamber and which has a nozzle orifice bored for the issuance of ink drops, the head including a lower electrode on the diaphragm in at least a region that corresponds to the pressure generating chamber, the lower electrode being overlaid with the piezoelectric vibrating element formed by a hydrothermal method, the piezoelectric vibrating element in turn being overlaid with an upper electrode, and the piezoelectric vibrating element having a film thickness of not less than 1 $\mu$m but not more than 10 $\mu$m. This structure can provide a laminated ink-jet recording head that has a strong joint between the diaphragm and the piezoelectric vibrating element and which can be driven on low voltage.

If the film thickness of the aforementioned piezoelectric vibrating element is less than 1 $\mu$m, the voltage necessary to issue the ink may potentially exceed the withstand voltage of the piezoelectric vibrating element; If the film thickness exceeds of 10 $\mu$m, the distance between adjacent pressure generating chambers is increased in order to prevent interference with the displacement of the piezoelectric vibrating element, which is by no means suitable for an ink-jet recording head of a high-density type.

The aforementioned diaphragm may be made of an electrically conductive material. By so doing, it can serve as both a conductive sheet and a lower electrode. In addition, at least that part of the aforementioned lower electrode which faces the piezoelectric vibrating element may be formed of a titanium layer. Further in addition, the aforementioned lower electrode may have a multilayer structure consisting of a titanium layer and another electrically conductive layer. And in addition, the aforementioned lower electrode may be formed of a titanium layer.

This titanium layer may have a film thickness of not less than a tenth but not more than twice the film thickness of the aforementioned piezoelectric vibrating element.

In addition, the aforementioned titanium layer may be formed such that the portion formed in the region corresponding to the pressure generating chamber has a smaller film thickness than the portion formed in the other region. By so doing, ink can be efficiently issued from the pressure generating chamber.

If the film thickness of the titanium layer is less than a tenth or more than twice the film thickness of the aforementioned piezoelectric vibrating element, the rigidity of the titanium layer prevents efficient issuance of the ink.

In addition, the aforementioned lower electrode may comprise a plurality of titanium films in superposition.

In addition, the aforementioned spacer may be formed of an electroformed article. And this electroformed article may be made of an alkali resistant material. Further in addition, the aforementioned spacer and the diaphragm may be made of the same material and united into one. In addition, the spacer and the diaphragm may be united as an electroformed article.

In addition, the aforementioned spacer may be made of a silicon substrate enclosed with a silicon dioxide film.

And in addition, at least part of the aforementioned piezoelectric vibrating element may be located within a recess formed in the aforementioned lower electrode in such a way that it is formed with a clearance provided to form a gap from both sidewalls of the recess.

Further in addition, a titanium oxide layer may be formed between the aforementioned diaphragm and the lower electrode. By so doing, the adhesion between the diaphragm and the lower electrode can be further improved.

In addition, the present invention provides a laminated ink-jet recording head including a spacer in which a pressure generating chamber is formed, a diaphragm that closes one side of the pressure generating chamber and which has a piezoelectric vibrating element of a flexural vibrating mode secured to the surface, and a nozzle plate that closes the other side of the pressure generating chamber and which has a nozzle orifice bored for the issuance of ink drops, the diaphragm being made of an electrically conductive material so as to function as an electrode.

The aforementioned spacer may be made of an electroformed article. In addition, the laminated ink-jet recording head of the invention may be of such a structure that the aforementioned spacer is joined to the aforementioned diaphragm. And in addition, the aforementioned diaphragm may be made of a titanium layer.

It should be noted that the aforementioned upper electrode may be formed on the entire surface of the aforementioned diaphragm. In addition, the aforementioned lower electrode may also be formed by a film forming technique.

In addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming a titanium layer in at least the region of the diaphragm that corresponds; to the pressure generating chamber, forming a layer of a piezoelectric material in a film thickness of not less than 1 $\mu$m but not more than 10 $\mu$m on the titanium layer by a hydrothermal method, and forming an electrode on the surface of the layer of a piezoelectric material.

And in addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming a titanium layer across one surface of the diaphragm, forming a layer of a piezoelectric layer in a film thickness of not less than 1 $\mu$m but not more than 10 $\mu$m by a hydrothermal method on a titanium layer formed in a region that corresponds to the pressure generating chamber, and forming an electrode on the surface of the layer of a piezoelectric material.

Further in addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming an insulation layer on the surface of the diaphragm which is open in at least a region that corresponds to the pressure generating chamber, forming a titanium layer in the opening, forming a layer of a piezoelectric material in a film thickness of not less than 1 $\mu$m but not more than 10 $\mu$m on the titanium layer by a hydrothermal method, and forming an electrode on the surface of the layer of a piezoelectric material.

In addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming a titanium layer across one surface of the diaphragm, forming an insulation layer which is open in at least a region that corresponds to the pressure generating chamber, forming a layer of a piezoelectric material in a film thickness of not less than 1 $\mu$m but not more than 10 $\mu$m on the titanium layer by a hydrothermal method, and forming an electrode on the layer of a piezoelectric material.

And in addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming a titanium layer across one surface of the diaphragm, forming a gold layer which is open in at least a region that corresponds to the pressure generating chamber, forming a layer of a piezoelectric material on the titanium layer by a hydrothermal method using the gold layer as a mask, removing the gold layer, and forming an electrode on the layer of a piezoelectric material after the removal of the gold layer. By thusly using the gold layer as a patterning mask in forming the layer of a piezoelectric material by a hydrothermal method, highly precise and optimal patterning can be accomplished. This is because the gold layer has such high resistance to the hydrothermal reaction solution used in the practice of a hydrothermal method that the shape of the mask can be retained satisfactorily.

Further in addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming an electrically conductive layer across one surface of the diaphragm, forming a recess in a region of the electrically conductive layer that corresponds to the pressure generating chamber, forming a titanium layer within the recess with a clearance being provided to form a gap from both sidewalls of the recess, forming a layer of a piezoelectric material on the titanium layer by a hydrothermal method, and forming an electrode on the layer of a piezoelectric material.

The aforementioned layer of a piezoelectric material may be formed in a film thickness of not less than 1 μm but not more than 10 μm. In addition, the aforementioned diaphragm may be formed of an electrically conductive material. And in addition, the process may further include the step of forming a titanium oxide layer between the aforementioned diaphragm and the titanium layer. In addition, the aforementioned spacer may be formed of an electroformed article. And in addition, the process may further include the step of joining the aforementioned spacer to the aforementioned diaphragm. In this case, the spacer may already have the pressure generating chamber formed in it; alternatively, the pressure generating chamber may be formed after the two members have been joined together.

In addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming the diaphragm of a titanium layer, forming a layer of a piezoelectric material by a hydrothermal method in a region of the diaphragm that corresponds to the pressure generating chamber, and forming an electrode on the surface of the layer of a piezoelectric material. This design permits the diaphragm to serve as the lower electrode, too, and at the same time, the titanium layer can be used to form the seed crystal from which the layer of a piezoelectric material is to be formed.

The manufacturing process of interest may further include the steps of forming the aforementioned spacer of an electroformed article and joining the spacer to the aforementioned diaphragm. This eliminates the need to dip the spacer in the hydrothermal reaction solution used in the practice of the aforementioned hydrothermal method, whereby the spacer is completely prevented from being attacked by the hydrothermal reaction solution.

And in addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming the diaphragm of a titanium layer, forming a layer of a piezoelectric material on the titanium layer by a hydrothermal method, joining the spacer to the titanium layer and then removing that portion of the layer of a piezoelectric layer which is formed in a region other than what corresponds to the pressure generating chamber, and forming an electrode on the surface of the layer of a piezoelectric material that is left intact in the region that corresponds to the pressure generating chamber.

In addition, the aforementioned step of forming a titanium layer may include the step of placing a plurality of titanium films in superposition.

And in addition, the present invention provides a process for producing a laminated ink-jet recording head comprising a spacer in which a pressure generating chamber is formed, a diaphragm that closes one side of the pressure generating chamber and which has a piezoelectric vibrator of a flexural vibrating mode secured to the surface, and a nozzle plate that closes the other side of the pressure generating chamber and which has a nozzle orifice bored for the issuance of ink drops, the process including the steps of forming the spacer and the diaphragm into an integral unit as an electroformed article, forming a titanium layer in at least a region of the diaphragm that corresponds to the pressure generating chamber, forming a layer of a piezoelectric material on the titanium layer by a hydrothermal method, and forming an electrode on the surface of the layer of a piezoelectric material. This contributes to simplification of the manufacturing process.

In addition, the aforementioned electroformed article may be formed of nickel.

Further, the present invention provides a printer or another apparatus that are equipped with the laminated ink-jet recording head having either of the designs described above.

According to the invention, there is realized such a structure that the crystal of the piezoelectric vibrating layer or element has grown on the lower electrode layer, particularly on the titanium layer and, hence, the two layers can be joined to have an extremely high strength and, in addition, the forming temperature can be made lower than in sintering to thereby eliminate the warpage due to thermal expansion mismatch. What is more, the piezoelectric vibrating element can be formed in such a small thickness as to impart satisfactory field strength even at low voltage.

BEST MODE FOR EMBODING THE INVENTION

We now describe modes of embodiment of the present invention with reference to the drawings.

First Embodiment

Figure 1A:
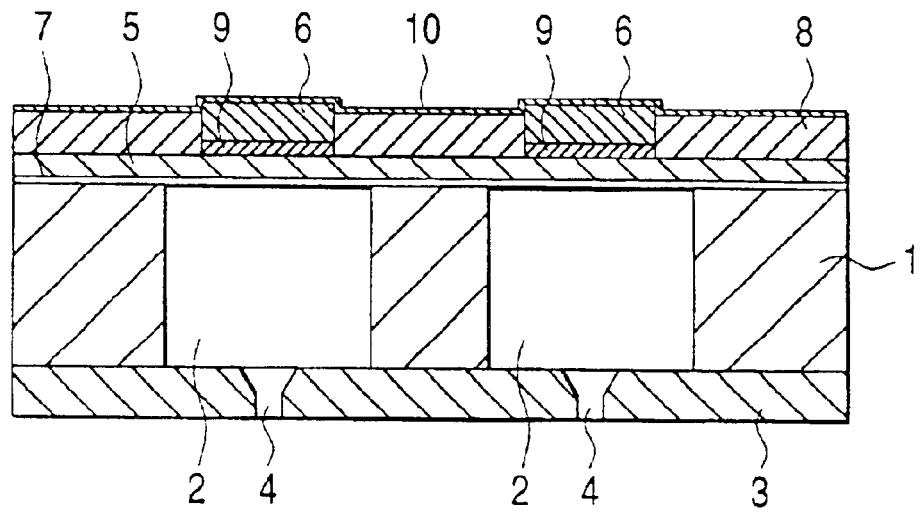
FIG. 1 are cross sections of laminated ink-jet recording heads, wherein (a) is according to an embodiment of the invention as taken in a direction perpendicular to the length of the pressure generating chamber; and (b) is a cross section of laminated ink-jet recording head according to the first embodiment of the invention as taken in a direction parallel to the length of the pressure generating chambers.
Figure 2:
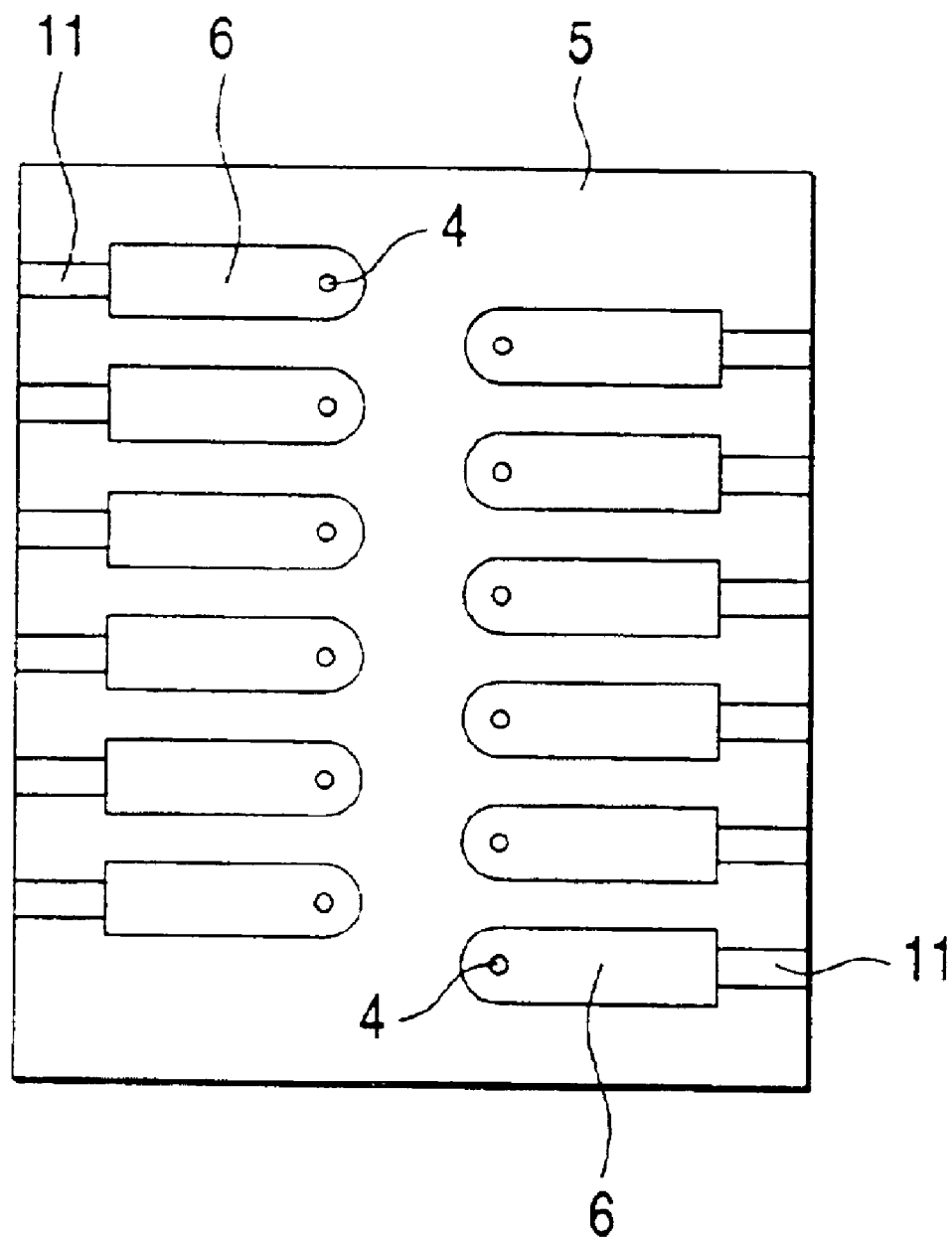
FIG. 2 is a plan view of the laminated ink-jet recording head shown in FIG. 1.

FIGS. 1(A) and (B) and FIG. 2 each show a first embodiment of the invention and in these drawings, numeral 1 signifies a spacer. The spacer is either made by performing anisotropic etching or chemical etching on a substrate, such as a single-crystal silicon substrate, a stainless steel substrate or the like, that have a film thickness (thickness) suitable for forming pressure generating chambers 2 in such a way that it is penetrated from one side to the other (from top to-bottom or from bottom to top as seen in FIG. 1(A)) or by press forming a ceramic green sheet and sintering it.

Numeral 3 signifies a nozzle plate. Nozzle orifices 4 are bored through the plate in positions that correspond to (communicate with) the pressure generating chambers 2. The plate is secured to one side of the spacer 1 by means of an adhesive or the like so as to provide an airtight condition.

Numeral 5 signifies a diaphragm that is made of a thin sheet elastic enough to be capable of being deformed by the flexural vibration of a piezoelectric vibrating element 6 to be described later, as exemplified by a thin sheet of a synthetic resin such as polyimide, a stainless steel processed to form an electrical insulating film on the surface or even a ceramic material. The diaphragm is secured to the spacer 1 via an adhesive layer 7 in such a way as to close the other side of the spacer and it combines with the spacer 1 and nozzle plate 3 to form pressure generating chambers 2.

Numeral 8 signifies an insulation layer formed on the surface of the diaphragm 5 which is made of an insulating material such as silicon dioxide ($SiO_2$), polyimide or the like. The insulation layer is formed in a film thickness of about, say, 1 μm in regions that correspond to the pressure generating chambers 2 in such a way as to form openings (windows) for assisting in the mounting of piezoelectric vibrators 6 by a hydrothermal method to be described later.

Numeral 9 signifies titanium layers that have a small enough film thickness (thickness) of about, say, 0.1 μm to supply an electric current capable of driving the piezoelectric vibrating elements 6 and which are formed by, for example, sputtering or the like within the openings (windows) in the insulation layer in positions that correspond to the pressure generating chambers 2. The titanium layers function as lower electrodes for the piezoelectric vibrating elements 6.

Numeral 6 signifies the aforementioned piezoelectric vibrating elements, which are synthesized by the hydrothermal method (hydrothermal synthesis method) to be described later, with the titanium layers 9 being used as substrates for growth. The piezoelectric vibrating elements are formed as a layer by causing a piezoelectric material to grow to such a film thickness (thickness) that their surface protrudes beyond the insulation layer 8. Flexural vibrations occur by charging the piezoelectric vibrating elements electrically. The vibrations cause an elastic deformation of the diaphragm 5, whereupon a pressure is generated in the ink within the pressure generating chambers 2 to have ink droplets issue through the nozzle orifices 4.

Figure 1B:
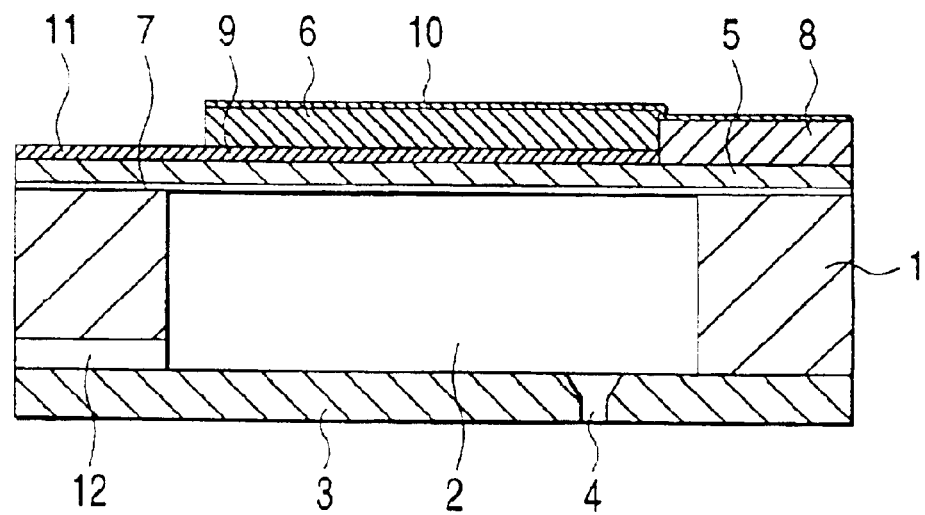

Numeral 10 signifies a common electrode layer which functions as an upper electrode and it is formed by sputtering an electrode forming material such as gold (Au) or the like on the surfaces of the piezoelectric vibrating elements 6 and the insulation layer 8. In FIG. 1(B), numeral 11 signifies leads from lower electrodes (discrete electrodes) and one lead is provided for each lower electrode (namely, each discrete electrode). Numeral 12 signifies ink feed ports that permit the pressure generating chambers 2 to communicate with a common ink chamber (not shown).

In this embodiment, when a drive signal is applied between a titanium layer 9 (which serves as a lower electrode) and the upper electrode (common electrode) to have the piezoelectric vibrating element 6 vibrate flexurally in such a way that it becomes convex toward the pressure generating chamber 2, the ink will issue from the pressure generating chamber 2 though the nozzle orifice 4. If the application of the drive signal is stopped, the piezoelectric vibrating element 6 reverts to the initial state and its deformation convex toward the pressure generating chamber is canceled, whereupon the pressure generating chamber 2 expands; as a result, the ink will flow out of the common ink chamber (not shown) to enter the pressure generating chamber 2 via the ink feed port 12 to thereby make up for the ink that has been consumed during printing.

As shown in FIG. 2, the aforementioned piezoelectric vibrating element 6 is formed in superposition on each of the open windows in the insulation layer which have been formed in a predetermined pattern (for example, in dots). Thus, the piezoelectric vibrating layer of the laminated ink-jet recording head shown in FIG. 1 is equipped with a plurality of piezoelectric vibrating elements 6 and a specified piezoelectric vibrating element can be energized by selective electrical charging through application of a voltage between a predetermined lower electrode 9 and a predetermined upper electrode. Therefore, the recording head under discussion enables a predetermined character pattern or the like to be printed on recording paper. It should be noted here that the combination of the piezoelectric vibrating element 6 and the lower and upper electrodes or the combination of the piezoelectric vibrating element 6 and either electrode is referred to as a piezoelectric vibrator.

The thus constructed laminated ink-jet recording head has such a structure that the crystal of the piezoelectric vibrating element 6 has grown on the titanium layer 9 and it hence features a high strength at joint; in addition, the piezoelectric vibrating element 9 is mounted at a much lower temperature than in sintering and hence, there is no development of warpage or residual stress in the diaphragm which would other occur due to thermal expansion mismatch.

In addition, the film thickness of the piezoelectric vibrating element 6 can be controlled by adjusting its growth time and, hence, it can be mounted as an extremely thin and uniform film. As a result, the field strength acting on the piezoelectric vibrating element is sufficiently increased to enable,great flexural vibrations to develop on a low drive voltage.

These advantages are achieved by fabricating the piezoelectric vibrating element by a hydrothermal synthesis method. We next describe the process for manufacturing the laminated ink-jet recording head in accordance with the process shown in FIGS. 3 and 4.

Figure 3A:
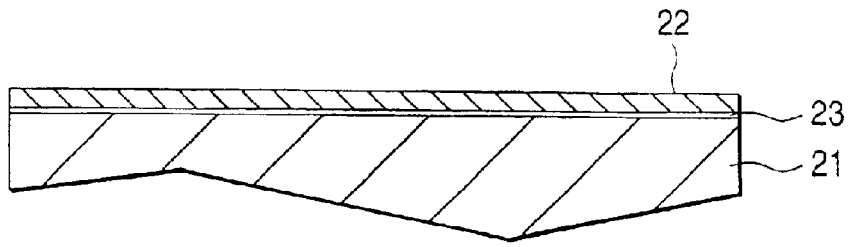
FIG. 3, parts (I) through (IV), shows in cross section a part of the process for manufacturing the laminated ink-jet recording head according to the first embodiment of the invention.
Figure 3B:
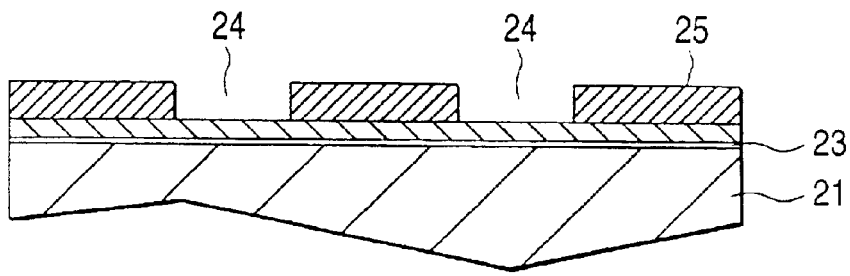
Figure 3C:
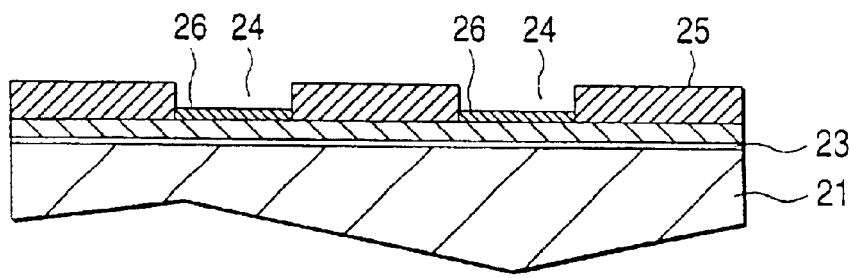
Figure 3D:
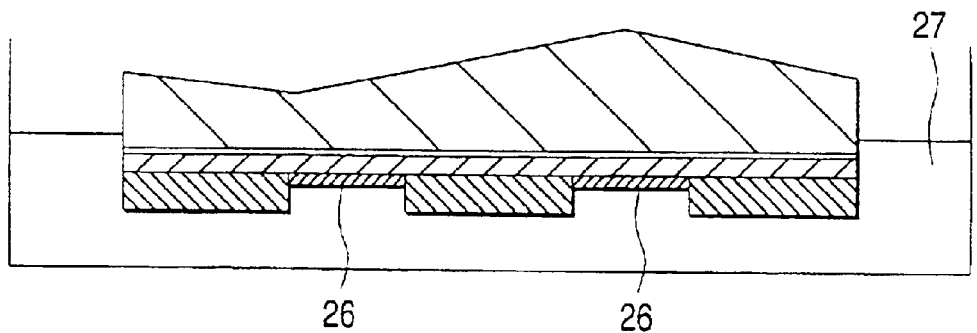

First, in the step shown in FIG. 3(I), a substrate 21 made of an etchable material, say, a stainless steel and which has a suitable film thickness as a space 1 is provided and one side of the substrate 21 is overlaid with a thin sheet 22 that is made of a material resistant to the liquid etchant for the substrate, as exemplified by a polyimide or the like, and which serves as a diaphragm (shown by numeral 5 in FIG. 1) that has an electrically insulating property at least on the surface, with an adhesive layer 23 interposed between 21 and 22.

Next, in the step shown in FIG. 3(II), an insulation layer 25 having a film thickness of about 1 $\mu$m is formed of silicon dioxide or polyimide in such a way that openings (windows) 24 will be located in regions of the surface of the thin sheet 22 that correspond to pressure generating chambers 2.

Subsequently, in the step shown in FIG. 3(III), using as a mask the insulation layer 25 formed in the step shown, in FIG. 3(II), a titanium layer 26 is formed in the regions where the openings (windows) 24 are located, or the regions that correspond to the pressure generating chambers 2, by sputtering or the like.

Next, in the step shown in FIG. 3(IV), the aforementioned substrate is dipped in a reaction solution 27 prepared by mixing an aqueous solution of lead nitrate ($Pb(NO_3)_2$), an aqueous solution of zirconium oxychloride ($ZrOCl_2 \cdot 8H_2O$), an aqueous solution of titanium tetrachloride ($TiCl_4$) and an aqueous solution of potassium hydroxide, and a hydrothermal treatment is conducted at 150° C.

In this reaction, the initial reaction solution does not contain titanium tetrachloride but the titanium source dissolving out of the titanium layer 26 is reacted with the Pb and Zr sources in the reaction solution, whereby the PZT seed crystal to be described later is precipitated to form a dense film on the surface of the titanium layer and, subsequently, the Ti source in the reaction solution is reacted with the Pb and Zr sources to have a lead titanate-lead zirconate layer (hereunder designated as "PZT layer") 28 grown on the seed crystal. In other words, the PZT layer is slowly grown with the titanium layer 26 serving as a substrate for growth. As a result, the already mentioned seed crystal adheres strongly to the titanium layer, probably causing the titanium layer and the piezoelectric element (PZT layer) to become integral at the interface by either chemical bonding or compositing to provide a rugged joint.

Subsequently, in the step shown in FIG. 4(I), the lead titanate-lead zirconate layer 28 which started growing in the step shown in FIG. 3(IV) continues to grow and when it has become thicker than the insulating layer 25, the substrate is taken out of the reaction solution 27.

Next, in the step shown in FIG. 4(II), the surface of the PZT layer 28 formed on the substrate taken out of the reaction solution 27 is polished by lapping to form a piezoelectric vibrating element 29 (corresponding to the piezoelectric vibrator 6 shown in FIG. 1). The aforementioned lapping (polishing) may be performed by, for example, a method of using diamond abrasive particles, chemical polishing or the like.

The lapping can not only improve the plane smoothness of the piezoelectric vibrator 29 but also control its film thickness. As a result, it becomes possible to easily form;, an even thinner and more uniform piezoelectric vibrator 29 and the strength of electric field acting on the piezoelectric vibrating element 29 can be further increased to make it possible to cause great flexural vibrations on an even lower drive voltage.

Subsequently, in the step shown in FIG. 4(III), evaporation or the like is performed on the substrate obtained in the step shown in FIG. 4(III) to form a gold (Au) layer 30 (corresponding to the common electrode 10 shown in FIG. 1) on the surface on which the aforementioned piezoelectric vibrating element 29 has been formed.

Next, in the step shown in FIG. 4(IV), an etching protective film (mask) corresponding to the shape of pressure generating chambers 2 is formed on the other side of the substrate 21 obtained in the step shown in FIG. 4(III). Then, with this etching protective film being used as a mask, etching is performed on the substrate 21 until it reaches the thin sheet 22. Thereafter, a nozzle plate 3 is fixed with an adhesive to complete a laminated ink-jet recording head.

Second Embodiment

Figure 5A:
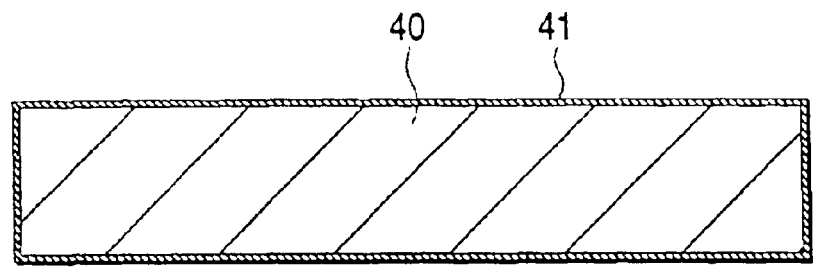
FIG. 5, parts (I) through (III) shows in cross section a part of the process for manufacturing a laminated ink-jet recording head according to a second embodiment of the invention.
Figure 5B:
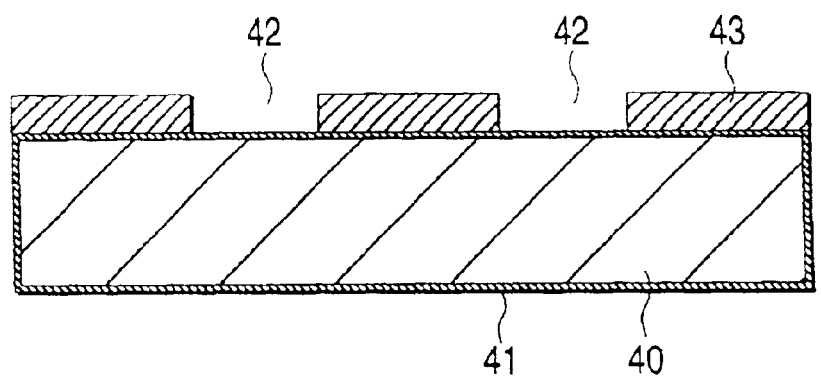
Figure 5C:
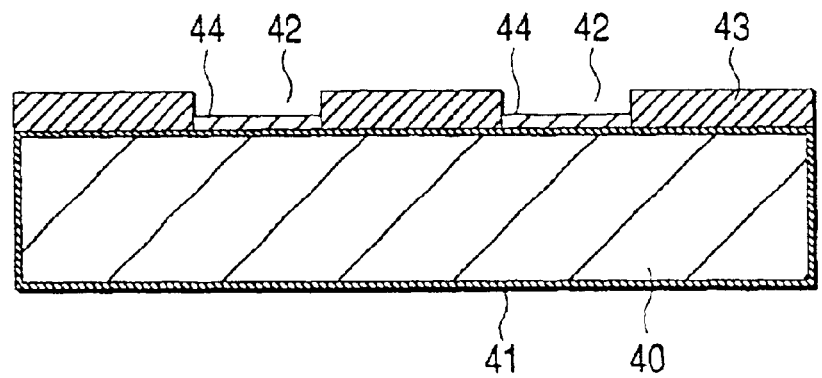

We next describe a second embodiment of the invention in accordance with the process shown in FIGS. 5 and 5. In this embodiment, description is made of the case where the spacer is formed of a single-crystal silicon substrate that can be etched anisotropically.

In the step shown in FIG. 5(A) all surfaces of a single-crystal silicon substrate 40 are treated by a thermal oxidation method to form a silicon dioxide film 41. The silicon dioxide film 41 also functions as an etching protective film in a subsequent step.

Next, in the step shown in FIG. 5(B), an insulation film 43 is formed on the silicon single-crystal substrate 40 having the silicon dioxide film 41 formed thereon, in such a way that it has openings (windows) 42 in positions that correspond to pressure generating chambers 50.

Next, in the step shown in FIG. 5(III), a titanium layer 44 is formed on the surface of the silicon dioxide film 41 via the openings (windows) 42 formed in the step shown in FIG. 5(II). In other words, the titanium layer 44 is formed in positions that correspond to pressure generating chambers 50.

Figure 4A:
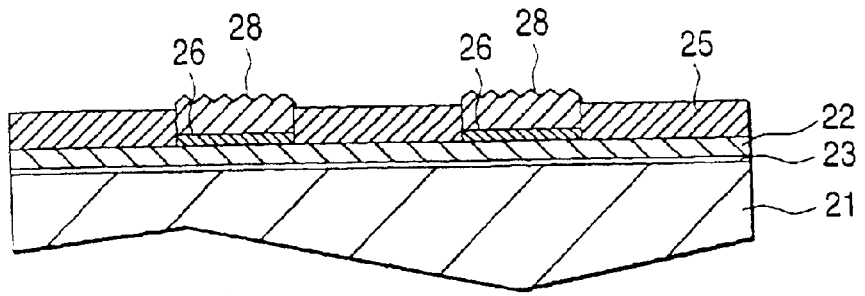
FIG. 4, parts (I) through (IV) shows in cross section another part of the process for manufacturing the laminated ink-jet recording head according to the first embodiment of the invention.
Figure 4B:
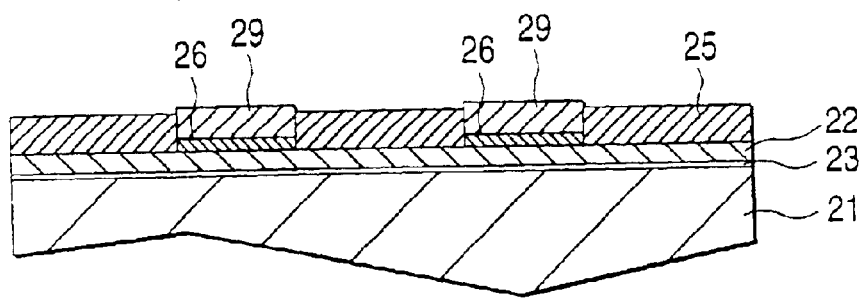
Figure 4C:
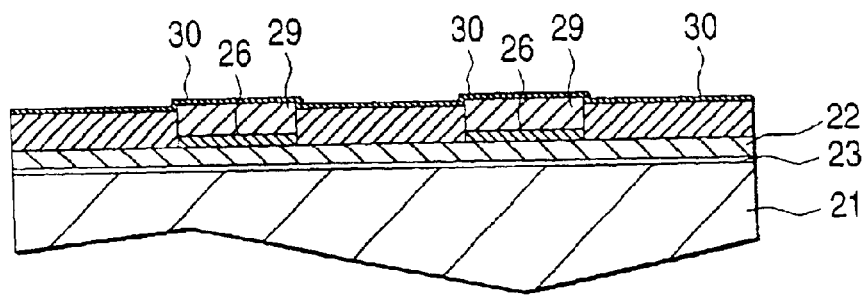
Figure 4D:
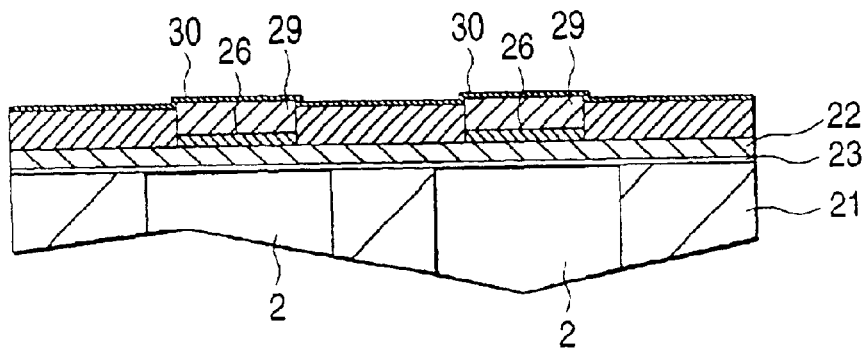
Figure 6A:
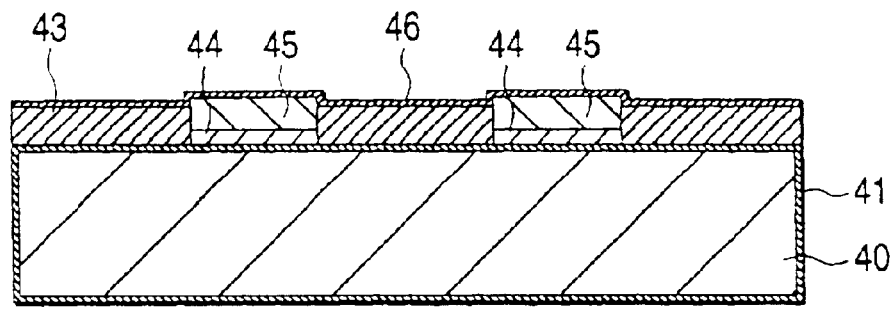
FIG. 6, parts (I) through (III) shows in cross section another part of the process for manufacturing the laminated ink-jet recording head according to the second embodiment of the FIG. 7 is a cross section showing another embodiment of the invention.

Next, in the step shown in FIG. 6(I), piezoelectric vibrators 45 and a common electrode layer 46 are formed on the surface of the titanium layer 44 formed in the step shown in FIG. 5(III), by the same method as in the aforementioned embodiment (the steps shown in FIG. 3(IV) and in FIGS. 4(I) to 4(III)).

Figure 6B:
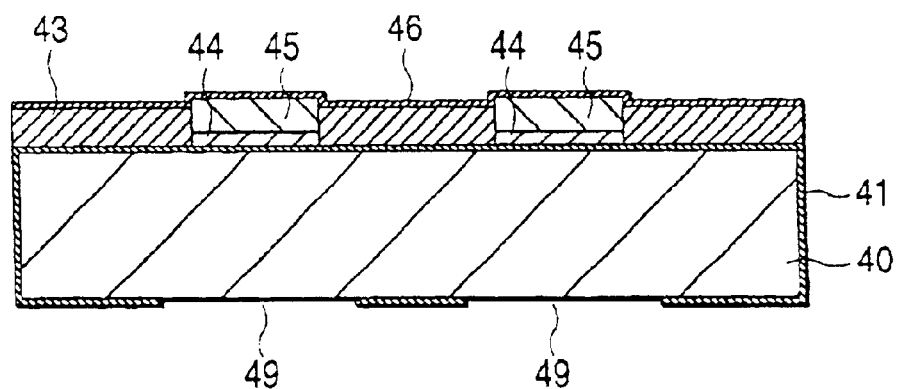
Figure 6C:
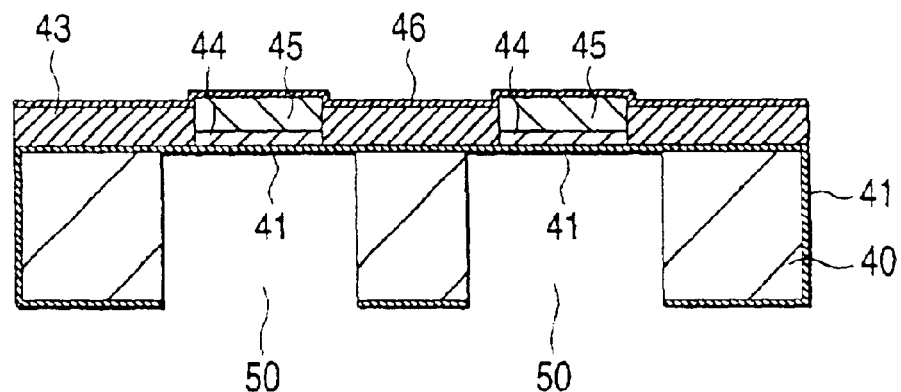

Next, in the step shown in FIG. 6(II), a mask (not shown) having openings (windows) corresponding to pressure generating chambers 50 is formed on the other side of the single-crystal silicon substrate 40 having the silicon dioxide film 41 formed thereon. Then, using this mask, the silicon dioxide film 41 is removed with hydrogen-fluoride such as to form openings (windows) 49 for the anisotropic etching to be performed in the subsequent step.

Next, in the step shown in FIG. 6(III), using as a mask the residual silicon dioxide film 41 formed in the step shown in FIG. 6(II), the single-crystal silicon substrate 40 is etched anisotropically down to the silicon dioxide film 41 on the side where the piezoelectric vibrating elements 45 are formed, by means of a liquid etchant which is typically an aqueous solution of potassium hydroxide at a concentration of about 17% which is warmed at 80° C. By this step, pressure generating chambers 50 are formed with the silicon dioxide film 41 serving as a diaphragm. Subsequently, although not shown, a nozzle plate is secured to the open side of the pressure generating chambers 50 by means of an adhesive or the like to thereby produce a precise and highly rigid laminated ink-jet recording head.

Figure 7:
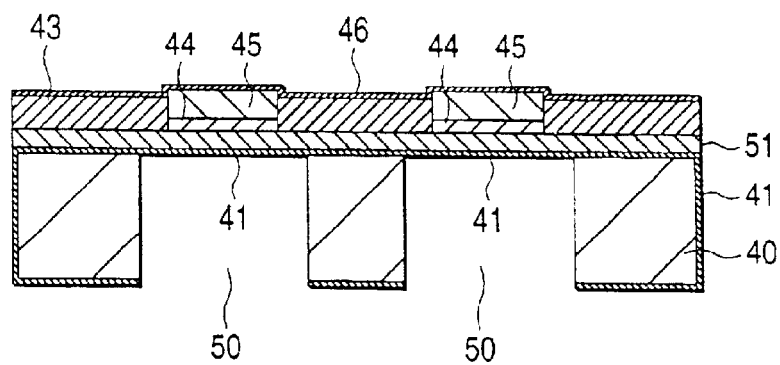

The foregoing description of the second embodiment concerns the case where the titanium layer 44 is formed directly on the surface of the silicon dioxide film 41; however, this is not the sole case of the invention and as shown in FIG. 7, a polyimide or other high-polymer layer 51 may be formed on the surface of the single-crystal silicon substrate 40 having the silicon dioxide film 41 before the insulation layer 43, titanium layer 44 and piezoelectric vibrators 45 are formed on the high-polymer layer 51 by the same steps as mentioned above. Subsequently, as in the steps shown in FIGS. 6(II) and 6(III), the other side of the single-crystal silicon substrate 40 having the silicon-dioxide film 41 formed thereon may be subjected to anisotropic etching so as to yield a laminated ink-jet recording head having a diaphragm of a two-layer structure consisting of the high-polymer layer 51 and the silicon dioxide film 41.

Third Embodiment

Figure 8A:
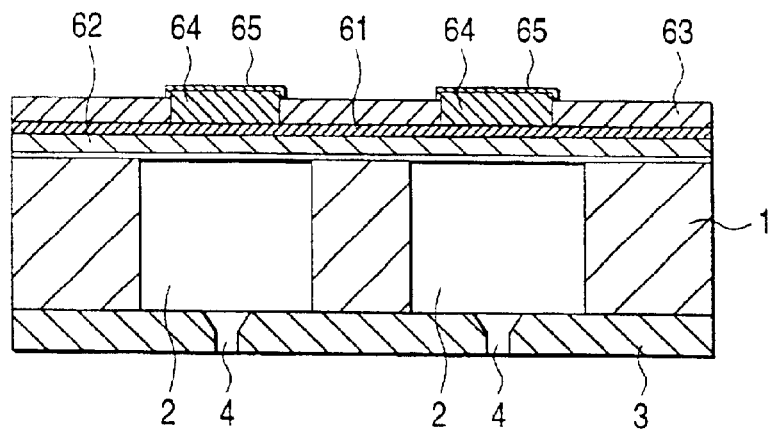
FIGS. 8(a) and (b) show in cross section a part of the process for manufacturing a laminated ink-jet recording head according to a third embodiment of the invention.
Figure 8B:
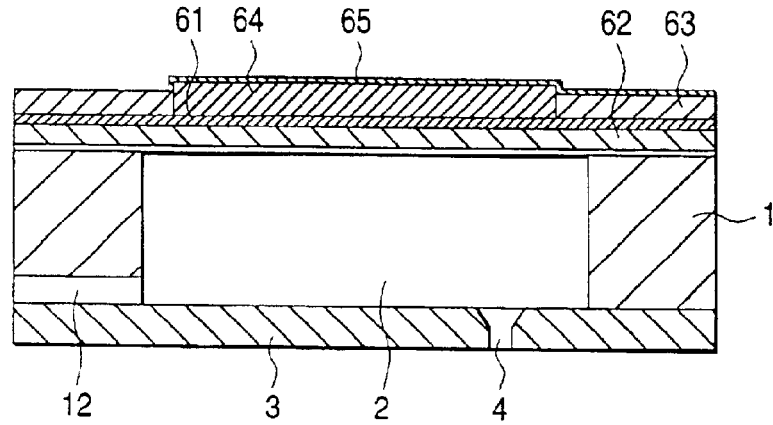

We next describe a third embodiment of the invention with reference to FIGS. 8(A) and 8(B).

In the drawings, numeral 61 signifies a titanium layer serving as a common lower electrode and this titanium layer 61 is formed in a film thickness of about 0.1 $\mu$m by sputtering titanium on the entire surface of a diaphragm 62. Numeral 63 signifies an insulation layer formed on the surface of the diaphragm-62 and this insulation layer 63 is formed of an insulation material such as silicon dioxide (SiO$_2$), polyimide or the like in a film thickness of about 1 $\mu$m in such a way as to form openings (windows in regions that correspond to pressure generating chambers 2.

Numeral 64 signifies a piezoelectric vibrating element, which is formed by growing a piezoelectric material on the titanium layer 61 serving as a substrate for growth by the hydrothermal method in such a film thickness (thickness) that its surface protrudes beyond the insulation layer 63. Numeral 65 signifies discrete electrodes that are formed by sputtering a gold (Au) layer on the surfaces of the individual piezoelectric vibrators 64 in such a way that the electrodes 65 are independent of each other with respect to the associated piezoelectric vibrator 64.

In the third embodiment, when a drive signal is applied between the titanium layer 61 serving as a common electrode and a specified discrete electrode 65 to have the associated piezoelectric vibrator 64 vibrate flexurally in such a way that it becomes convex toward a specified pressure generating chamber 2, the ink issues from the pressure generating chamber 2 through a nozzle orifice 4.

If the application of the drive signal is stopped, the piezoelectric vibrator 64 reverts to the initial state and the pressure generating chamber 2 expands, whereupon the ink flows into the pressure generating chamber 2 via the ink feed port 12 to thereby make up for the aforementioned issued ink (which has been consumed during printing).

In the third embodiment, the titanium layer 61 is formed on the entire surface of the diaphragm 62 prior to the formation of the insulation layer 63 and thereafter the aforementioned step shown in FIG. 3(II) is performed to form the insulation layer 63 having openings (windows) provided in positions that correspond to the pressure generating chambers 2. Then, the step shown in FIG. 3(IV) is performed to form PZT layers 64. Thereafter, a method is applied such that gold (Au) or the like is selectively evaporated on the surface of each PZT layer 64 to form a discrete electrode 65.

According to the third embodiment, the titanium layer 61 can be formed on the entire surface of the diaphragm 62 and, what is more, a common electrode lead need be provided at only one site for the titanium layer 61. Therefore, unlike in the aforementioned modes of embodiment, there is no need to form the titanium layer selectively or to form a number of electrode leads and, hence, the overall process can be further simplified. In addition, the titanium layer can be formed with higher reliability than in the case of forming it via the openings (windows) in the insulation layer.

Figure 9:
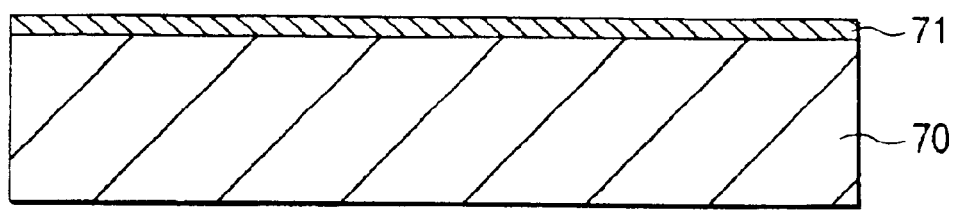
FIG. 9 is a cross section showing the structure of a substrate that can be used with the laminated ink-jet recording head of the invention.

The foregoing description of the third embodiment concerns the case where the diaphragm 62 is superposed on the surface of the substrate serving as spacer 1 and in which the titanium layer 61 is formed on the surface of the diaphragm 62 by evaporation, sputtering or the like; however, this is not the sole case of the invention and, as shown in FIG. 9, a thin titanium sheet 71 may be joined by explosive bonding or the like onto the surface of a spacer substrate such as a stainless steel 70 and the aforementioned steps may be performed on the resulting performer (starting material).

Figure 10:
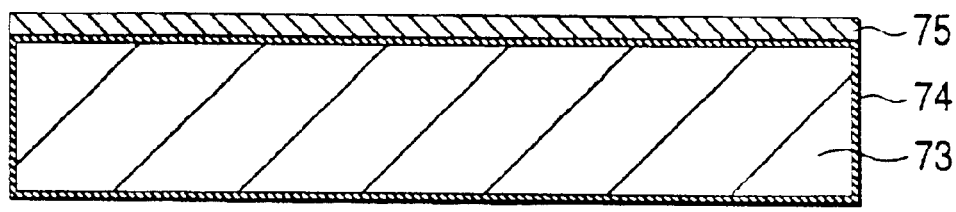
FIG. 10 is a cross section showing the structure of another substrate that can be used with the laminated ink-jet recording head of the invention.

Further in addition, if anisotropic etching is to be employed, one may use a substrate which, as shown in FIG. 10, has a silicon dioxide film 74 formed on a single-crystal silicon substrate 73 with a thin titanium sheet 75 being joined to one surface by explosive bonding or the like.

Fourth Embodiment

Figure 11A:
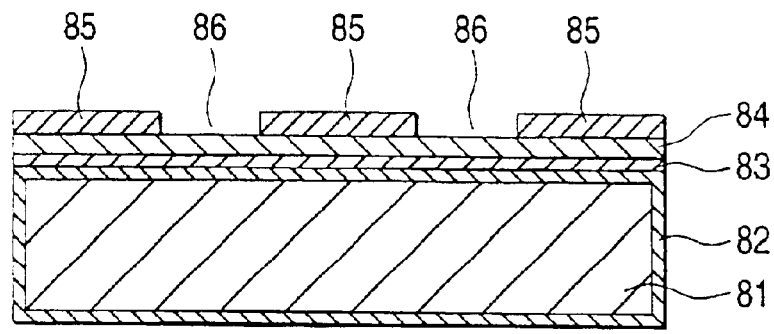
FIG. 11, parts (I) through (III) shows in cross section a part of the process for manufacturing a laminated ink-jet recording head according to a fourth embodiment of the invention.
Figure 11B:
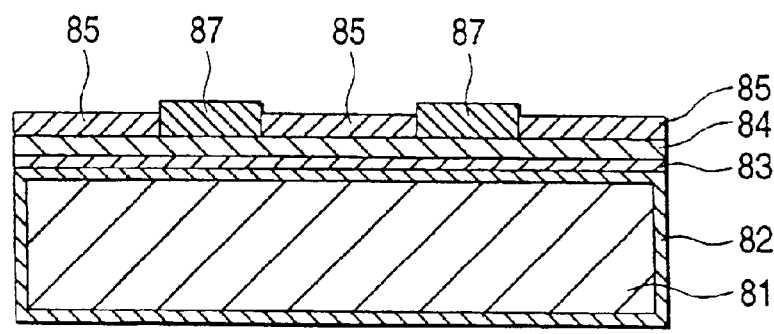
Figure 11C:
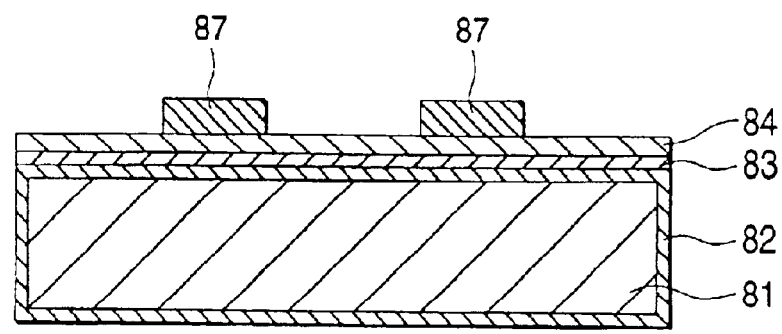

We next describe a fourth embodiment of the invention in accordance with the process shown in FIG. 11.

In the step shown in FIG. 11(I), a silicon dioxide film 82 is formed on all surfaces of a single-crystal silicon substrate 81 by a thermal oxidation method. Then, the silicon dioxide film 82 is overlaid with a platinum (Pt) layer 83 which, in turn, is overlaid with a titanium layer 84. Subsequently, a gold (Au) layer 85 is formed on the titanium layer 84 such that openings (windows) 86 are provided in positions that correspond to the pressure generating chambers 2 described in connection with the aforementioned modes of embodiment.

The gold (Au) layer 85 plays the role of a mask in the subsequent step of forming a PZT layer 87. The reason for using gold (Au) as the material to form the mask is that it is not corroded by the reaction solution to be used in a hydrothermal reaction. Besides gold (Au), nickel (Ni), platinum (Pt) and the like may also be used.

Next, in the step shown in FIG. 11(II), a PZT layer 87 is formed in the regions where the aforementioned openings (windows) 86 have been formed in the step shown in FIG. 11(I), using the steps shown in aforementioned FIG. 3(IV) and FIG. 4(I) via the openings (windows) 86, namely, using the gold (Au) layer 85 as a mask.

Subsequently, in the step shown in FIG. 11(III), the gold (Au) layer 85 used as a mask in the step shown in FIG. 11(II) is removed by means of an etching solution typically consisting of 425 g of potassium iodide (KI), 1750 g of water ($H_2O$) and 227 g of iodine ($I_2$). The gold (Au) layer 85 is removed in order to prevent the occurrence of shorting between the common electrode (lower electrode) and the discrete electrodes (upper electrodes) which are to be formed in a subsequent step. Then, the step shown in aforementioned FIG. 3(II) is performed to polish the surface of the PZT layer 87 by lapping so as to form piezoelectric vibrators.

Thereafter, an insulation film is formed in a predetermined position and the steps shown in aforementioned FIGS. 6(I) to 6(III) are performed; thereafter, a nozzle plate is secured to the open side of the resulting pressure generating chambers by means of an adhesive or the like so as to produce a precise and highly rigid laminated ink-jet recording head.

It should be noted that the lower electrode (common electrode) of the laminated ink-jet recording head according to the fourth embodiment has a multilayer structure consisting of the platinum (Pt) layer 83 and the titanium layer 84. The multilayer structure contributes to a further improvement in the adhesion of films.

It should also be noted that the effective portion of the lower electrode which is made of the platinum (Pt) layer 83 in the fourth embodiment may be comprised of electrode materials such as nickel (Ni), gold (Au), aluminum (Al) and the like. This design (of using various electrode materials in the effective portion of the lower electrode) offers the advantage of enabling the use of a suitable electrode that is selected in accordance with a specific object in consideration of cost, electrical resistance, Young's modulus and the like.

Fifth Embodiment

Figure 12:
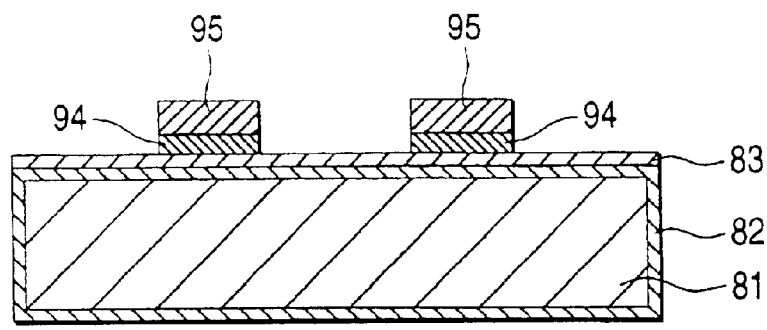
FIG. 12 shows in cross section a part of the process for manufacturing a laminated ink-jet recording head according to a fifth embodiment of the invention.

We next describe a fifth embodiment of the invention in accordance with the step shown in FIG. 12.

In the step shown in FIG. 12, a silicon dioxide film 82 is formed on all surfaces of a single-crystal silicon substrate 81 by a thermal oxidation method. Then, a platinum (Pt) layer 83 is formed on the silicon dioxide film 82. Subsequently, a titanium layer 94 is selectively formed on the platinum (Pt) layer 83 in positions that correspond to the pressure generating chambers 2 described in connection with the aforementioned modes of embodiment.

Next, the steps shown in aforementioned FIG. 3(IV) and FIG. 4(I) are performed on the substrate having the titanium layer 94 thusly formed on it, whereby a PZT layer 95 is selectively formed on the titanium layer 94. The platinum (Pt) layer 83 becomes exposed in the areas where the titanium layer 94 is not formed but this causes no problem since the platinum (Pt) layer 83 is resistant to the corrosive action of the reaction solution 27. Subsequently, the step shown in aforementioned FIG. 3(II) is performed to polish the surface of the PZT layer 87 by lapping so as to form piezoelectric vibrators.

Thereafter, an insulation film is formed in a predetermined position and the steps shown in aforementioned FIGS. 6(I) to 6(III) are performed; thereafter, a nozzle plate is secured to the open side of the resulting pressure generating chambers by means of an adhesive or the like so as to produce a precise and highly rigid laminated ink-jet recording head.

Sixth Embodiment

Figure 13A:
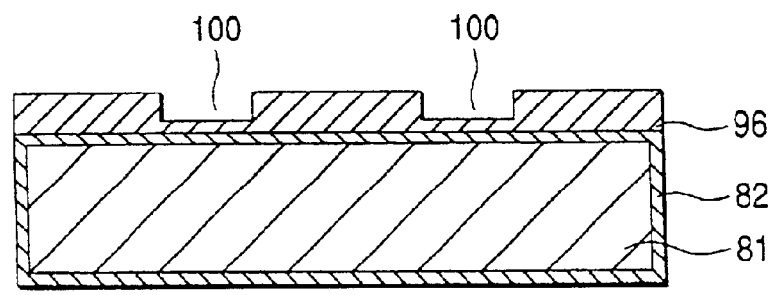
FIG. 13, parts (I) through (II) shows in cross section a part of the process for manufacturing a laminated ink-jet recording head according to a sixth embodiment of the invention.
Figure 13B:
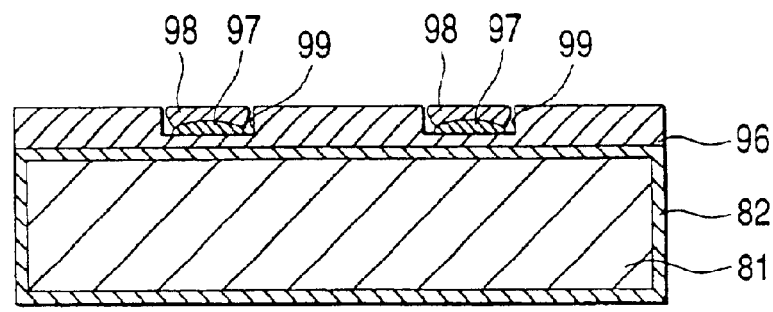

We next describe a sixth embodiment of the invention in accordance with the manufacturing process shown in FIG. 13.

In the step shown in FIG. 13(I), a silicon dioxide film 82 is formed on all surfaces of a single-crystal silicon substrate 81. Then, a nickel (Ni) layer 96 is formed on the silicon dioxide film 82. Subsequently, a mask is patterned on the resulting nickel (Ni) layer 96 such that openings (windows) 100 are formed in the nickel (Ni) layer 96 in positions that correspond to the pressure generating chambers 2 described in connection with the aforementioned modes of embodiment and, thereafter, etching is performed with a nitric acid solution. In this way, recesses 100 are formed in the nickel (Ni) layer 96.

Next, in the step shown in FIG. 13(II), a titanium layer is formed by sputtering or the entire surface of the nickel (Ni) layer 96 which has been prepared in the step shown in FIG. 13(I) and which has recesses 100 formed in it. Subsequently, a mask is patterned over the titanium layer such that part of the titanium layer formed within the recesses 100 will remain and, thereafter, the titanium layer is etched. In this way, titanium layer 97 is allowed to remain within each recess 100 such that it forms a gap 99 from each of the sidewalls that define the recess 100 (the sidewalls of the nickel (Ni) layer 96).

Subsequently, the steps shown in aforementioned FIG. 3(IV) and FIG. 4(I) are performed on the substrate having the titanium layers 97 formed on it, whereby a PZT layer 98 is selectively formed on the titanium layers 97. The thus formed PZT layer 98 has a clearance to form a gap 99 from the nickel (Ni) layer 96. The PZT layer has such a nature that upon voltage application, it deforms not only in a vertical direction but also in a horizontal direction. In the embodiment under consideration, the presence of the aforementioned gap 99 can suppress the horizontal displacement and constraining which will occur when a voltage is applied to the PZT layer (namely, the piezoelectric vibrator 6 shown in FIG. 1). As a result, the device can be driven on an even lower voltage.

Then, an insulation film is formed in a predetermined position and the steps shown in aforementioned FIGS. 6(I) to 6(III) are performed; thereafter, a nozzle plate is secured; to the open side of the resulting pressure generating chambers by means of an adhesive or the like so as to produce a precise and highly rigid laminated ink-jet 4 recording head. It should be noted that the lower electrode (common electrode) of the laminated ink-jet recording head according to the sixth embodiment has a two-layer structure consisting of the nickel (Ni) layer 96 and the titanium layer 97.

Seventh Embodiment

Figure 14A:
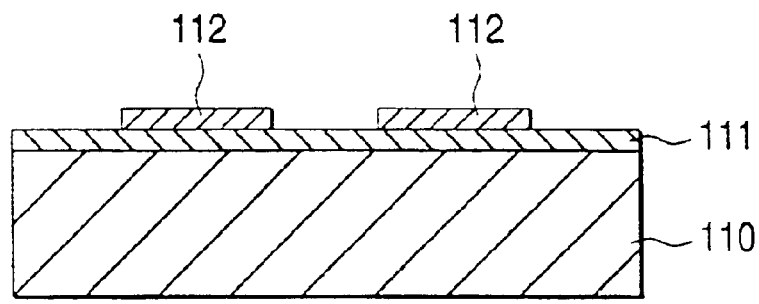
FIG. 14, parts (I) through (III) shows in cross section a part of the process for manufacturing a laminated ink-jet recording head according to a seventh embodiment of the invention.
Figure 14B:
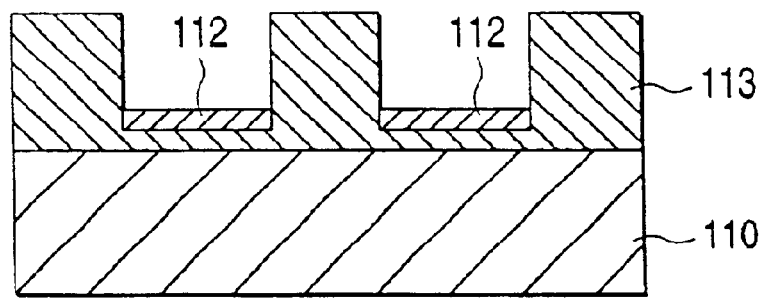
Figure 14C:
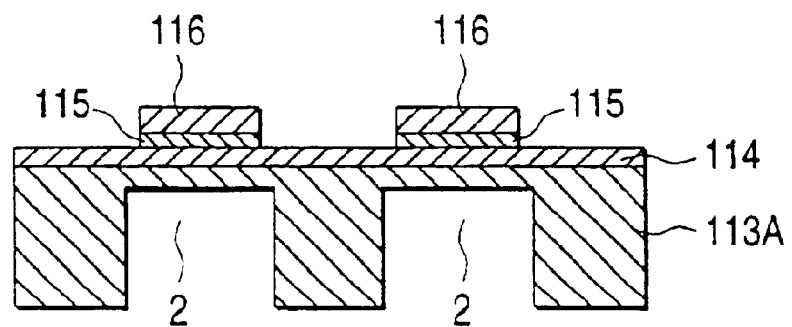

We next describe a seventh embodiment of the invention in accordance with the manufacturing process shown in FIG. 14.

In the step shown in FIG. 14(I), a nickel (Ni) layer 111 is formed in a film thickness of 2 $\mu$m by a sputtering method on a glass substrate 110. Then, a photoresist film 112 is formed on the nickel (Ni) layer 111 in regions that correspond to the aforementioned pressure generating chambers 2.

Next, in the step shown in FIG. 14(II), the glass substrate 110 on which the nickel (Ni) layer 111 and the photoresist film 112 have been formed in FIG. 14(I) is dipped in an electroforming bath (temperature=60° C.) consisting of nickel sulfate (350 g/L), nickel chloride (45 g/L) and boric acid (30 g/L) and, with the photoresist film 112 used as a mask, nickel is allowed to precipitate and grow at a current density of 5 Å/dm$^2$. The grown nickel layer 113 serves as a spacer.

It should be noted that in order to obtain a precise shape, the aforementioned photoresist may be replaced by a light-sensitive resin or the like to form a shape, followed by nickel precipitation and growth.

Subsequently, in the step shown in FIG. 14(III), the photoresist film 112 is removed and the glass substrate 11 is stripped to leave an electroformed nickel cavity 113A behind. The electroformed nickel cavity 113A may be polished as required. It should be noted here that the space between adjacent nickel layers 113 provides a pressure generating chamber 2. It should also be noted that the nickel layer 111 present in the region where the aforementioned photoresist film 112 was formed serves as a diaphragm. Next, a platinum (Pt) layer 114 is formed on the side of the electroformed nickel cavity 113A remote from the side where the pressure generating chambers are formed, by the same method as shown in FIG. 12. Subsequently a titanium layer 115 is selectively formed on the platinum (Pt) layer 114 in positions that correspond to the pressure generating chambers 2 and a PZT layer 115 is also formed.

Thereafter, desired steps such as the formation of upper electrodes and the like are performed and then a nozzle plate is secured to the open side of the resulting pressure generating chambers by means of an adhesive or the like so as to produce a precise and highly rigid laminated ink-jet recording head.

In the seventh embodiment, an electroformed nickel cavity is used and there are no size limitations such as those of silicon wafers and, hence, it s possible to produce an elongated recording head such as a line head. To be more specific, a recording head can be formed in such a length that it can be provided across the entire width of an article on which prints are to be produced (for example, paper). A printer using such a line head can produce desired prints without moving the head.

In addition, the spacer and the diaphragm can be formed into an integral unit by electroforming in the embodiment under consideration and, hence, the manufacturing process can be further simplified.

Further in addition, it should be noted that the foregoing description of the seventh embodiment which concerns the case of using nickel as the material of electroformed cavity is not the sole case of the invention and that a cavity formed of a material such as copper or iron may be coated with nickel in order to impart alkali resistance. In the embodiment under consideration, the platinum layer 114 is formed as a lower electrode but a diaphragm also serving as the lower electrode may be composed by electroforming.

Eighth Embodiment

Figure 15A:
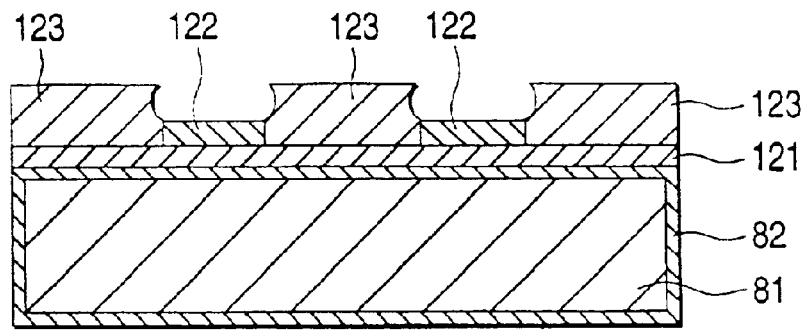
FIG. 15, parts (I) through (III) shows in cross section a part of the process for manufacturing a laminated ink-jet recording head according to an eighth embodiment of the invention.
Figure 15B:
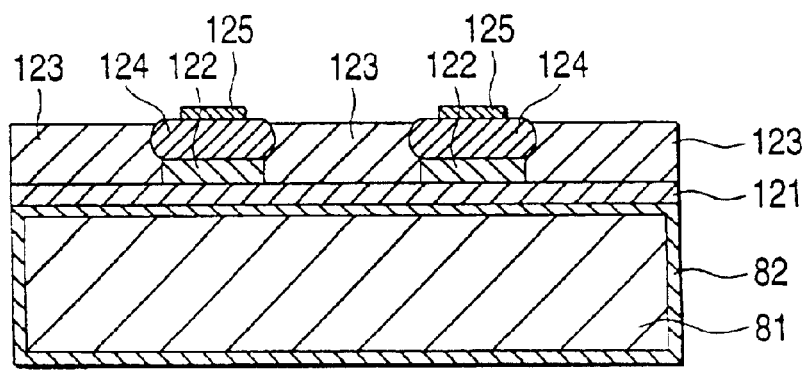
Figure 15C:
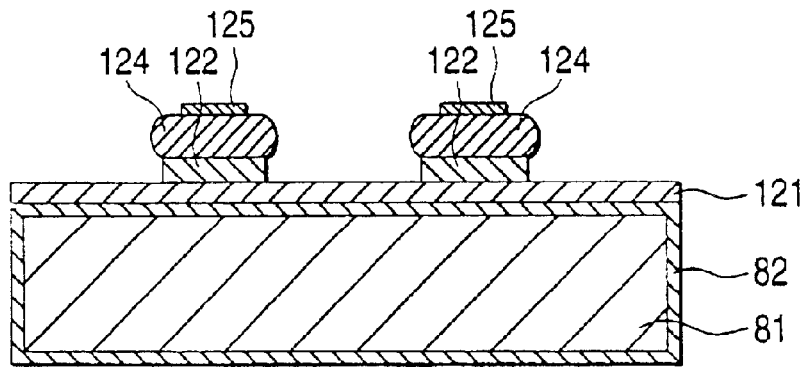

We next describe an eighth embodiment of the invention in accordance with the manufacturing process shown in FIG. 15.

In the step shown in FIG. 15(I), a silicon dioxide film 82 is formed on all surfaces of a single-crystal silicon substrate 81 by a thermal oxidation method. Then, a platinum (Pt) layer 121 is formed on the silicon dioxide film 82. Subsequently, a titanium layer 122 if formed on the resulting platinum (Pt) layer 12 in positions that correspond to the pressure generating chambers 2 described in connection with the aforementioned modes of embodiment, by means of the same patterning and etching techniques as described above. Then, a nickel (Ni) layer is formed in the areas of the platinum (Pt) layer 121 where the titanium layer 122 is not formed and it is grown by the same method as in the seventh embodiment to thereby form an electroformed nickel layer 123. The electroformed nickel layer 123 is such that its top slightly overhangs an adjacent titanium layer 122.

Next, in the step shown in FIG. 15(II), the steps shown in aforementioned FIG. 3(IV) and FIG. 4(I) are performed to selectively form a PZT layer 124 on the aforementioned titanium layer 122. Subsequently, upper electrodes 125 are formed on the PZT layer 124.

Subsequently, in the step shown in FIG. 15(III), the electroformed nickel layer 123 is removed. The thusly formed PZT layer 124 does not adhere to any lateral sides of the titanium layer 122 and, hence, the horizontal displacement and constraining which will occur when a voltage is applied to the PZT layer 124 (namely, the piezoelectric vibrator 6 shown in FIG. 1) can be suppressed. As a result, the device can be driven on an even lower voltage.

Next, an insulation film is formed in a predetermined position and the steps shown in FIGS. 6(I) to 6(III) are performed; thereafter, a nozzle plate is secured to the open side of the resulting pressure generating chambers by means of an adhesive or the like so as to produce a precise and highly rigid laminated ink-jet recording head. It should be noted that the lower electrode (common electrode) of the laminated ink-jet recording head according to the sixth embodiment has a two-layer structure consisting of the platinum (Pt) layer 121 and the titanium layer 122.

It should also be noted that in the eighth embodiment, a gold layer or the like may be formed instead of the platinum (Pt) layer 12. In addition, the electroformed nickel layer 123 may be replaced by an electroformed copper layer, an electroformed iron layer or the like, which are then with nickel only on the surface.

Ninth Embodiment

Figure 16:
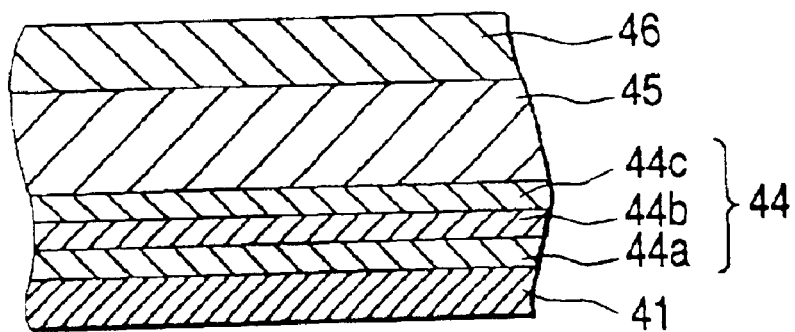
FIG. 16 is an enlarged cross section of an area near the lower electrode of a laminated ink-jet recording head according to a ninth embodiment of the invention.

We next describe a ninth embodiment of the invention with reference to FIG. 16. FIG. 16 is an enlarged cross section of an area near the lower electrode of the laminated ink-jet recording head of the invention.

As shown in FIG. 16, the laminated ink-jet recording head according to this embodiment has the same structure as the laminated ink-jet recording head shown in the second embodiment, except that the titanium layer 44 serving as the lower electrode has such a structure that a plurality of titanium films (three in the embodiment under consideration) 44a to 44c are superposed.

The titanium films 44a to 44c are successively formed by DC sputtering or a like method in such a way that one film is superposed on another.

With this structure of the lower electrode (titanium layer 44) in which a plurality of titanium films 44a to 44c are superposed, the film thickness of one layer can be sufficiently reduced to prevent the formation of defects in the titanium layer 44. In addition, the multilayer structure of the titanium layer 44 can prevent the formation of defects that penetrate the titanium layer 44.

It should be noted that this laminated structure of the lower electrode is applicable not only to the laminated ink-jet recording head according to the embodiment two of the invention but also to the laminated ink-jet recording head according to the embodiment one and to the embodiment three to eight.

Tenth Embodiment

Figure 17:
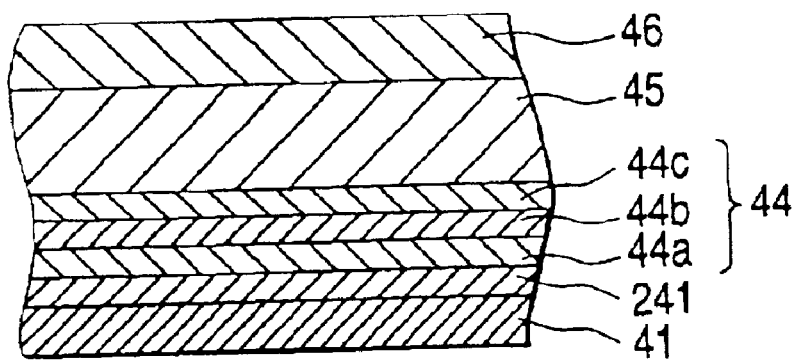
FIG. 17 is an enlarged cross section of an area near the lower electrode of a laminated ink-jet recording head according to a tenth embodiment of the invention.

We next describe a tenth embodiment of the invention with reference to FIG. 17. FIG. 17 is an enlarged cross section of an area near the lower electrode of the laminated ink-jet recording head of the invention.

As shown in FIG. 17, the laminated ink-jet recording head according to this embodiment has the same structure as the laminated ink-jet recording head shown in the ninth embodiment, except that a titanium oxide layer 241 is formed between the silicon dioxide film 41 and the titanium layer 44.

The titanium oxide layer 241 is formed by forming a titanium layer by a DC sputtering technique and thereafter performing thermal oxidation in an oxygen atmosphere at 900° C. or by applying reactive sputtering method in a 10% oxygen atmosphere or by a like method.

Thus, in the laminated ink-jet recording head according to the embodiment under consideration, the titanium oxide layer 241 formed between the silicon dioxide film 41 and the titanium layer 44 exhibits excellent alkali resistance to thereby fulfill its function as a protective film for the silicon substrate.

It should be noted that the titanium oxide layer 241 is applicable not only to the laminated ink-jet recording head according to the embodiment nine but also to the laminated ink-jet recording head according to the modes of embodiment one to eight.

In the modes of embodiment one to ten descried above, gold is used in the upper electrode but this is not the sole case of the invention and various other conductive metals such as platinum, aluminum, copper, iron and the like may of course be used.

Eleventh Embodiment

Figure 18A:
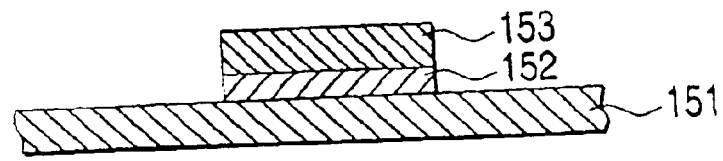
FIG. 18, parts (I) through (III) shows in cross section a part of the process for manufacturing a laminated ink-jet recording head according to an eleventh embodiment of the invention.
Figure 18B:
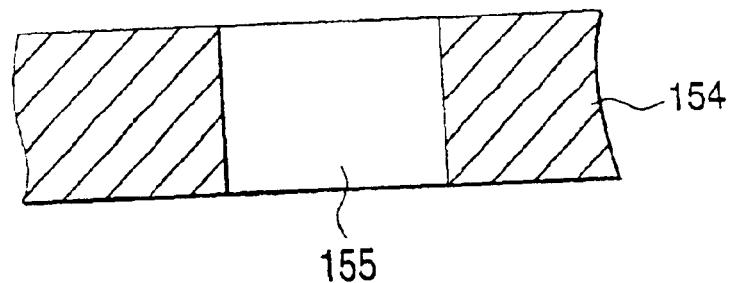
Figure 18C:
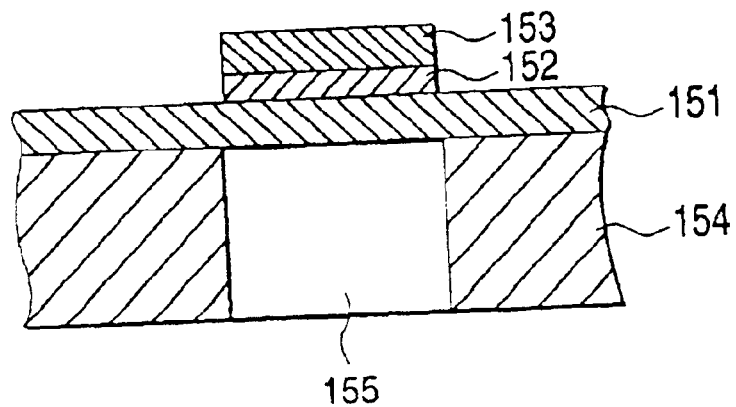

We next describe an eleventh embodiment of the invention in accordance with the process shown in FIGS. 18(I) to 18(III).

In the step shown in FIG. 18(I), a nickel foil 151 having a film thickness of about 5 to 10 μm is provided and a titanium layer 152 is formed on the nickel foil 151 in areas that correspond to those regions where pressure generating chambers 155 are to be later formed. Then, a hydrothermal method is performed as in the aforementioned modes of embodiment, thereby forming a PZT layer 153 in a film thickness of about 7 μm on the titanium layer 152.

In the separate step shown in FIG. 18(II), a spacer 154 made of a single-crystal silicon substrate is subjected to selective anisotropic etching so as to form pressure generating chambers 155.

Next, in the step shown in FIG. 18(III), the nickel foil 151 on which the titanium layer 152 and the PZT layer 153 were formed in the step shown in FIG. 18(I) is diffusion joined to the spacer 154 in which the pressure generating chambers 155 were formed. In this case, the two members are joined in such a way that the titanium layer 152 and the PZT layer 153 are provided in positions that correspond to the regions where the pressure generating chambers 155 are formed.

Thereafter, desired steps such as the formation of upper electrodes and the like are performed and, then, a nozzle plate is secured to the open side of the resulting pressure generating chambers by means of an adhesive or the like, thereby producing a precise and highly rigid laminated ink-jet recording head.

In the thus produced laminated ink-jet recording head, the nickel foil 151 serves not only as a diaphragm but also as a lower electrode. Therefore, the manufacturing process can be simplified.

It should be noted that the nickel foil 151 used as the diaphragm/lower electrode in the embodiment under consideration is not the sole case of the invention but may be replaced by foils of any other metals such as platinum, gold and the like.

In the embodiment under consideration, a single-crystal silicon substrate is used as spacer 154 but this is not the sole case of the invention and any desired substrates such as a stainless steel substrate, a ceramic green sheet that has been press formed and subsequently sintered, an electroformed article and the like may be employed. In addition, the pressure generating chambers can be formed not only by anisotropic etching but also by chemical etching and the like.

Further in addition, the foregoing description of the eleventh embodiment which concerns the case where the nickel foil 151 is diffusion joined to the spacer 154 is not the sole case of the invention and the nickel foil 151 may be joined to the spacer 154 by other means such as the use of an adhesive or the like.

In the embodiment under discussion, the spacer 154 need not be dipped in the hydrothermal reaction solution which is used when forming the PZT layer 153 and, hence, the spacer is fully prevented from being attacked by the hydrothermal reaction solution.

Twelfth Embodiment

Figure 19A:
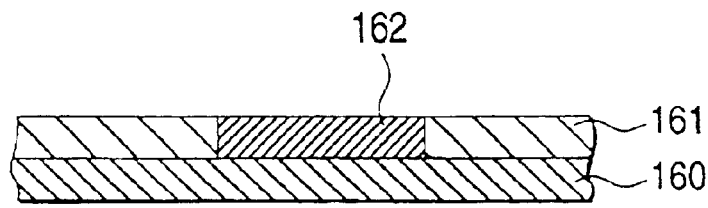
FIG. 19, parts (I) through (III) shows in cross section a part of the process for manufacturing a laminated ink-jet recording head according to a twelfth embodiment of the invention.
Figure 19B:
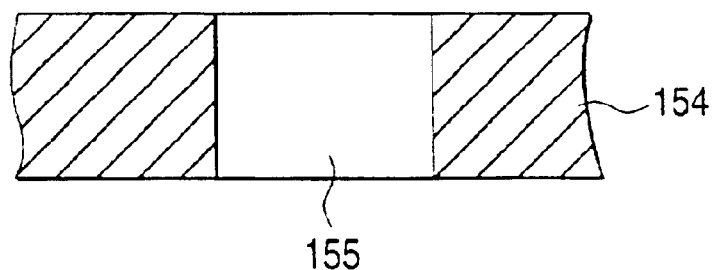
Figure 19C:
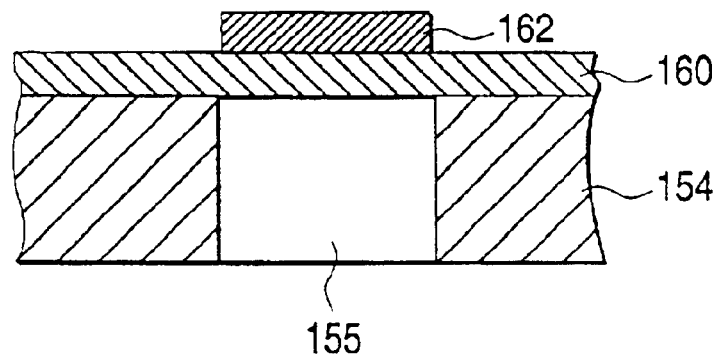

We next describe a twelfth embodiment of the invention in accordance with the process shown in FIGS. 19(I) to 19(III).

In the step shown in FIG. 19(I), a titanium foil 160 having a film thickness of about 5 to 10 μm is provided and a gold layer 161 is formed on the titanium foil 160 in such a way that openings are made in areas which later become regions that correspond to pressure generating chambers. Then, with the gold layer 161 used as a mask, a hydrothermal method is performed as in the aforementioned modes of embodiment, thereby forming a PZT layer 162 in a film thickness of about 7 μm on the titanium foil 160.

In the separate step shown in FIG. 19(II), a spacer 154 made of a single-crystal silicon substrate is subjected to selective anisotropic etching so as to form pressure generating chambers 155.

Next, in the step shown in FIG. 19(III), the gold layer 160 formed in the step shown in FIG. 19(II) is removed. Thereafter, the titanium foil 160 on which the PZT layer 162 was formed is diffusion joined to the spacer 154 in which the pressure generating chambers 155 were formed. In this case, the two members are joined in such a way that the PZT layer 162 is provided in positions that correspond to the regions where the pressure generating chambers 155 are formed.

Thereafter, desired steps such as the formation of upper electrodes and the like are performed and, then, a nozzle plate is secured to the open side of the resulting pressure generating chambers by means of an adhesive or the like, thereby producing a precise and highly rigid laminated ink-jet-recording head.

In the thus produced laminated ink-jet recording head, the titanium foil 160 serves not only as a diaphragm but also as a lower electrode and, in addition, it can be used as a seed crystal for forming the PZT layer 162. Therefore, the manufacturing process can be simplified.

It should be noted that as in the eleventh embodiment the spacer 154 used in the twelfth embodiment may comprise any desired substrate such as a stainless steel substrate, a ceramic green sheet that has been press formed and subsequently sintered, an electroformed article or the like. In addition, the pressure generating chambers can be formed not only by anisotropic etching but also by chemical etching and the like. Further in addition, the titanium foil 160 and the spacer 154 may be joined by means of an adhesive or the likes In this embodiment, too, the spacer 154 need not be dipped in the hydrothermal reaction solution which is used when forming the PZT layer 162 and, hence, the spacer is fully prevented from being attacked by the hydrothermal reaction solution. In addition, the use of the gold layer 161 having high resistance to the hydrothermal reaction solution to be used in the practice of the hydrothermal method allows highly precise and optimal patterning to be accomplished.

Thirteenth Embodiment

Figure 20A:
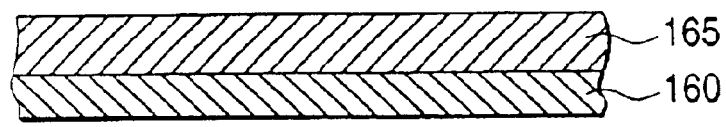
FIG. 20, parts (I) through (III) shows in cross section a part of the process for manufacturing a laminated ink-jet recording head according to a thirteenth embodiment of the invention.
Figure 20B:
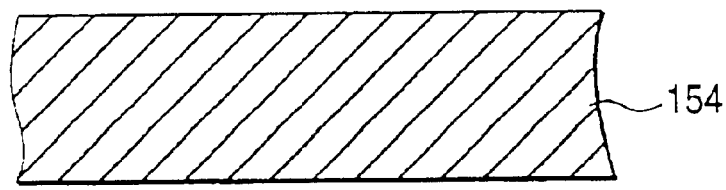
Figure 20C:
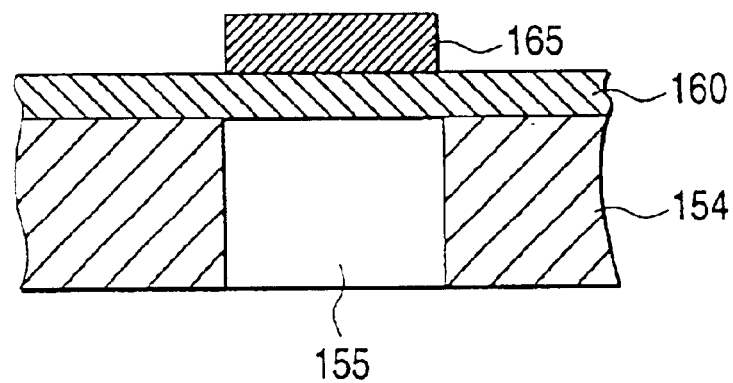

We next describe a thirteenth embodiment of the invention in accordance with the process shown in FIG. 20(I) to FIG. 20(III).

In the step shown in FIG. 20(I), a titanium foil 16 having a film thickness of about 5 to 10 μm is provided and a PZT layer 165 is formed on one surface of the foil in a film thickness of about 7 μm by the same hydrothermal method as in the aforementioned modes of embodiment.

In the separate step shown in FIG. 20(II), a spacer 154 made of a single-crystal silicon substrate is provided.

Next, in the step shown in FIG. 20(III), the titanium foil 160 which has the PZT layer 165 formed thereon in the step shown in FIG. 20(I) is diffusion joined to the spacer 154. Then, anisotropic etching is selectively performed on the spacer 154 to form pressure generating chambers 155. Subsequently, ion milling is performed on the PZT layer 156 to remove the PZT layer 156 formed in the regions other than those which correspond to the pressure generating chambers 155. In this way, the PZT layer 165 is formed in the regions of the titanium foil 160 which correspond to the pressure generating chambers 155.

Thereafter, desired steps such as the formation of upper electrodes and the like are performed and, then, a nozzle plate is secured to the open side of the resulting pressure generating chambers by means of an adhesive or the like, thereby producing a precise and highly rigid laminated ink-jet recording head.

In the thus produced laminated ink-jet recording head, the titanium foil 160 serves not only as a diaphragm but also as a lower electrode and, in addition, it can be used as a seed crystal for forming the PZT layer 165. Therefore, the manufacturing process can be simplified.

It should be noted that as in the eleventh embodiment, the spacer 154 used in the thirteenth embodiment may comprise any desired substrate such as a stainless steel substrate, a ceramic green sheet that has been press formed and subsequently sintered, an electroformed article or the like. In addition, the pressure generating chambers can be form not only by anisotropic etching but also by chemical etching and the like. Further in addition, the titanium foil 160 and the spacer 154 may be joined by means of an adhesive or the like.

In this embodiment, too, the spacer 154 need not be dipped in the hydrothermal reaction solution which is used when forming the PZT layer 165 and, hence, the spacer is fully prevented from being attacked by the hydrothermal reaction solution.

In addition, in the embodiment under discussion, the PZT layer 165 is patterned after the spacer 154 is joined to the titanium foil 160 and this offers the advantage of eliminating the need to perform registration when joining the spacer 154 to the titanium foil 160.

It should be noted that forming the pressure generating chambers 155 in the spacer 154 after the latter is joined to the titanium foil 160 in the thirteenth embodiment is not the sole case of the invention and that the spacer 154 having the pressure generating chambers 155 formed therein may subsequently be joined to the titanium foil 160.

It should additionally be noted that the foregoing description of the thirteenth node of embodiment with respect to the case where the titanium foil 160 serves not only as a diaphragm but also as a lower electrode while working as a seed crystal for forming the PAT layer 165 will in no way limit the invention and that the diaphragm and the lower electrode may be formed of a foil of metal such as nickel, platinum, gold or the like; alternatively, the diaphragm may be adapted to be independent of the lower electrode.

Fourteenth Embodiment

Figure 21A:
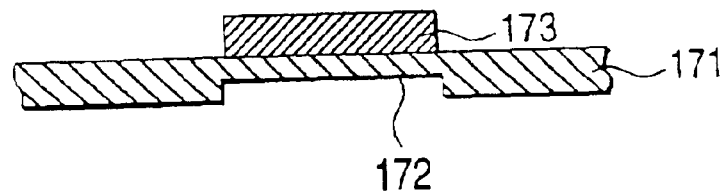
FIG. 21, parts (I) through (III) shows in cross section a part of the process for manufacturing a laminated ink-jet recording head according to a fourteenth embodiment of the invention.
Figure 21B:
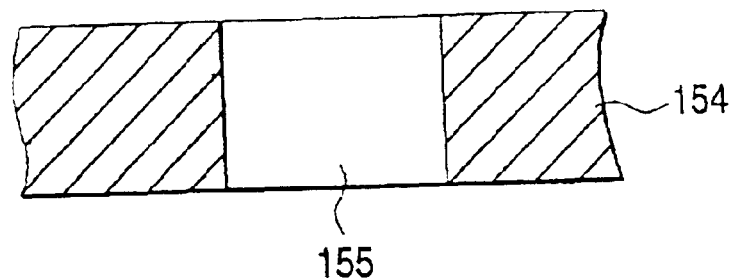
Figure 21C:
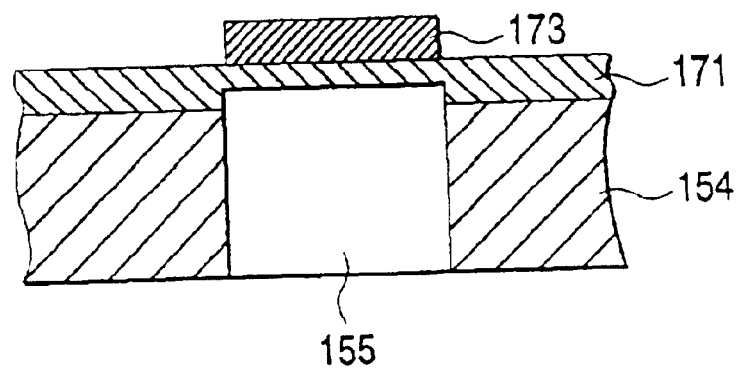

We next describe a fourteenth embodiment of the invention in accordance with the process shown in FIG. 21(I) to FIG. 21(III).

In the step shown in FIG. 21(I), a titanium foil 171 having a film thickness of about 20 to 50 μm is provided and the side (underside) of the foil to which spacer 154 is to be joined is etched in areas that are to become regions which correspond to pressure generating chambers 155, whereby grooves 172 are formed in those areas. By so doing, the film thickness of the titanium foil 171 in the areas that are to become the regions which correspond to the pressure generating chambers is adjusted to about 5 μm. Then, a PZT layer 173 is formed in a film thickness of about 7 μm by the aforementioned hydrothermal method on the top surface of the titanium foil 171 in the areas that are to become the regions which correspond to the pressure generating chambers 155.

In the separate step shown in FIG. 21(II), anisotropic etching is selectively performed on the spacer 154 made of a single-crystal silicone substrate, thereby forming the pressure generating chambers 155.

Next, in the step shown in FIG. 21(III), the titanium foil 160 which has the PZT layer 173 formed in the step shown in FIG. 21(I) is diffusion joined to the spacer 154 formed in the step shown in FIG. 21(II). On this occasion, registration of the grooves 172 and the pressure generating chambers 155 is effected.

Thereafter, desired steps such as the formation of upper electrodes and the like are performed and, then, a nozzle plate is secured to the open side of the resulting pressure generating chambers by means of an adhesive or the like, thereby producing a precise and highly rigid laminated ink-jet recording head.

In the thus produced laminated ink-jet recording head, the titanium foil 171 serves not only as a diaphragm but also as a lower electrode and, in addition, it can be used as a titanium source which serves as a seed crystal for forming the PZT layer 173. Therefore, the manufacturing process can be simplified.

In addition, it goes without saying that similar results are obtained if grooves 172 are formed on the PZT layer side such that the PZT layer 173 is formed within the grooves 172. Further in addition, the titanium foil 171 may be replaced by a nickel foil which has a titanium film formed thereon.

It should be noted that as in the eleventh embodiment, the spacer 154 used in the fourteenth embodiment may comprise any desired substrate such as a stainless steel substrate, a ceramic green sheet that has been press formed and subsequently sintered, an electroformed article or the like. In addition, the pressure generating chambers can be formed not only by anisotropic etching but also by chemical etching and the like. Further in addition, the titanium foil 171 and the spacer 154 may be joined by means of an adhesive or the like.

In this embodiment, too, the spacer 154 need not be dipped in the hydrothermal reaction solution which is used when forming the PZT layer 173 and, hence, the spacer is fully prevented from being attacked by the hydrothermal reaction solution.

Fifteenth Embodiment

Figure 22:
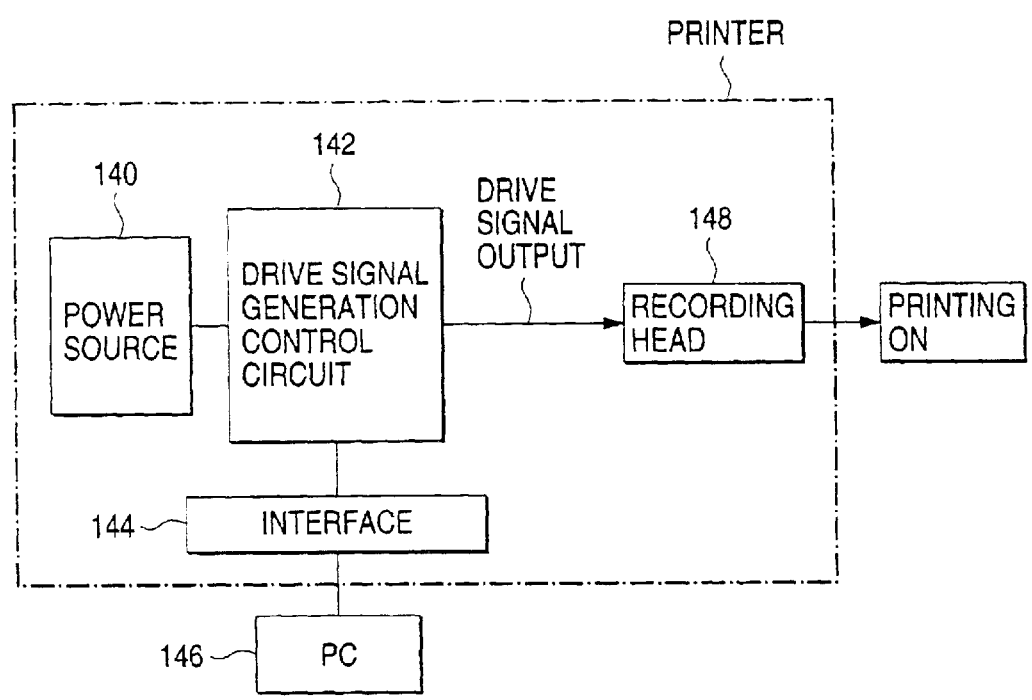
FIG. 22 is a block diagram of a printer equipped with a laminated ink-jet recording head according to a fifteenth embodiment of the invention.

We next describe a fifteenth embodiment of the invention with reference to FIG. 22. FIG. 22 is a block diagram for the construction of a printer apparatus equipped with the-already described laminated ink-jet recording head.

The printer apparatus comprises a power supply unit 140, a drive signal generation control unit 142, an interface 144 connected to a personal computer's console and the already described recording head 146 which operates in response to a drive signal.

The drive signal control unit 142 applies a predetermined voltage to a predetermined lower electrode and upper electrode in response to a print control signal supplied from the personal computer's console via the interface 144. As a result, that part of the piezoelectric vibrating elements which is located between the charged upper and lower electrodes is allowed to flex and vibrate selectively; if a plurality of piezoelectric vibrating elements corresponding to predetermined dots are charged simultaneously, each of the plurality of pressure generating chambers that correspond to the charged piezoelectric vibrating elements can issue ink toward the target of printing (for example, recording paper), thereby enabling predetermined character codes, graphics and the like to be printed on the recording paper. It should be noted that the interface may be provided on the personal computer's side.

While the foregoing description concerns the case where a printer apparatus equipped with the laminated ink-jet recording head is used as an output device for a personal computer, it goes without saying that the laminated ink-jet recording head of the present invention can also be used as record/write means in apparatus (systems) that perform recording/writing on recording media such as paper, as exemplified by facsimile, copiers, plotters, video printers, label printers and the like.

In the already described modes of embodiment, the piezoelectric vibrating elements are made of a PZT film for the reason that a sufficient amount of deformation can be produced by flexural vibrations but it should be noted that this is not the sole case of the invention and other perovskite-type ferroelectric ceramics such as PZT films (of a three-component system) which have magnesium and lead niobate added as a third component may also be used.

As descried above, according to the modes of embodiment of the invention, the piezoelectric vibrating layer or element is formed in such a way that the crystal has grown on the lower electrode layer, particularly on the titanium layer and this contributes to an extremely strong joint while, at the same time, the forming temperature can be made sufficiently lower than in sintering that the warpage due to thermal expansion mismatch can be eliminated. In addition, the piezoelectric vibrating element can be formed in such a small thickness that a sufficient field strength can be imparted on low voltage. Therefore, even if a sufficient field strength is applied to the piezoelectric vibrating element with a view to deforming it by an increased amount, the dielectric vibrating element will not separate from the lower electrode since the two are joined with high strength; in addition, the absence of warpage in the piezoelectric vibrating element ensures a sufficient amount of its deformation to produce a high pressure of ink issuance. Therefore, ink can be issued positively and rapidly even if the ink chamber is extremely small and filled with a very small amount of ink. As a consequence of this, sharp letters, images and the like which have high resolution can be printed on recording paper.

INDUSTRIAL APPLICABILITY

According to the present invention, there is provided a laminated ink-jet recording head which has such a structure that piezoelectric vibrating elements having a film thickness of 1 to 10 $\mu$m are formed on an electrode layer by a hydrothermal method, thereby allowing the piezoelectric vibrating elements to be formed by crystal growth on the electrode layer, and which also has satisfactory characteristics. In addition, the strength of joint between the diaphragm and each of the piezoelectric vibrating elements can be significantly improved while enabling their drive on an even lower voltage. What is more, no warpage will occur in the diaphragm and the piezoelectric vibrating elements on account of thermal expansion mismatch and this contributes to an improved yield and reliability. Additionally, thin piezoelectric vibrating elements can be formed by controlling the time of the hydrothermal reaction and this has the advantage of enabling the issuance of ink drops in response to drive signals of low voltage level.

If the diaphragm is made of an electrically conductive material, the diaphragm can also serve as a lower electrode. In addition, if the lower electrode is made of titanium layer, it can be utilized as a titanium source for the seed crystal from which the aforementioned piezoelectric vibrating elements are to be formed.

And in addition, if the spacer in which the pressure generating chambers are to be formed is made by electroforming, there are no size limitations such as those of silicon wafers and, hence, it is possible to produce an elongated recording head such as a line head.

Further in addition, if the lower electrode is designed have a multilayer structure consisting of a titanium layer and another conductive layer, the adhesion between the lower electrode and the piezoelectric vibrating element can be further improved.

In addition, if the lower electrode is designed to have a structure in which a plurality of titanium films are superposed, the film thickness one titanium film can be sufficiently reduced to prevent the formation of defects in the titanium film. As a result, there can be provided a highly reliable lower electrode.

And in addition, if a titanium oxide layer is formed between the diaphragm and the lower electrode, the titanium oxide layer works as a protective film for the silicon substrate and, as a result, the silicon substrate can be prevented from being attacked during etching or other steps that are performed in manufacture.

And in addition, if at least part of the aforementioned piezoelectric vibrating element is formed within a recess formed in the aforementioned lower electrode, with a clearance provided to form a gap from both sidewalls of the recess, the horizontal displacement and constraining which will occur when a voltage is applied to the piezoelectric vibrating element can be suppressed and, as a result, the device can be driven on an even lower voltage.

In addition, if the spacer is joined to the diaphragm on which the piezoelectric vibrating elements have been formed, there is provided an advantage is that the spacer will not be attacked by the hydrothermal solution reaction which is used in the practice of the hydrothermal method for forming the piezoelectric vibrating elements.

And in addition, after the spacer is joined to the diaphragm on which a layer has been provided for forming the piezoelectric vibrating elements, the layer for forming the piezoelectric vibrating elements may be patterned in registry with the positions of the pressure generating chambers, thereby forming the piezoelectric vibrating elements. This design offers the advantage of eliminating the need to achieve registry between the diaphragm and the spacer when they are being joined together.

What is claimed is:

1. A process for producing a laminated ink-jet recording head comprising a spacer in which a pressure generating chamber is formed, a diaphragm that closes one side of said pressure generating chamber and which has a piezoelectric vibrator of a flexural vibrating mode secured to the surface, and a nozzle plate that closes the other side of said pressure generating chamber and which has a nozzle orifice bored for the issuance of ink drops, said process comprising:

forming an insulation layer to define openings located in one or more regions of said diaphragm that correspond to the pressure generating chamber;

forming a titanium layer in at least one of the regions where the openings are located;

forming a layer of a piezoelectric material in a film thickness of not less than 1 $\mu$m but not more than 10 $\mu$m on said titanium layer by a hydrothermal method; and forming an electrode on the surface of said layer of a piezoelectric material.

2. A process for producing a laminated ink-jet recording head according to claim 1, wherein said diaphragm is formed of an electrically conductive material.

3. A process for producing a laminated ink-jet recording head according to claim 2, wherein said spacer is formed of an electroformed article.

4. A process for producing a laminated ink-jet recording head according to claim 2, wherein said step of forming a titanium layer includes the step of placing a plurality of titanium films in superposition.

5. A process for producing a laminated ink-jet recording head according to claim 1, which further includes the step of forming a titanium oxide layer between said diaphragm and the titanium layer.

6. A process for producing a laminated ink-jet recording head according to claim 5, wherein said spacer is formed of an elecroformed article.

7. A process for producing a laminated ink-jet recording head according to claim 5, wherein said step of forming a titanium layer includes the step of placing a plurality of titanium films in superposition.

8. A process for producing a laminated ink-jet recording head according to claim 1, wherein said spacer is formed of an electroformed article.

9. A process for producing a laminated ink-jet recording head according to claim 8, which further includes the step of joining said spacer to said diaphragm.

10. A process for producing a laminated ink-jet recording head according to claim 1, wherein said step of forming a titanium layer includes the step of placing a plurality of titanium films in superposition.

11. A process for producing a laminated ink-jet recording head comprising a spacer in which a pressure generating chamber is formed, a diaphragm that closes one side of said pressure generating chamber and which has a piezoelectric vibrator of a flexural vibrating mode secured to the surface, and a nozzle plate that closes the other side of said pressure generating chamber and which has a nozzle orifice bored for the issuance of ink drops, said process comprising:

forming a titanium layer in at least the region of said diaphragm that corresponds to the pressure generating chamber;

forming a layer of a piezoelectric material in a film thickness of not less than 1 $\mu$m but not more than 10 $\mu$m on said titanium layer by a hydrothermal method;

forming an electrode on the surface of said layer of a piezoelectric material; and forming a titanium oxide layer between said diaphragm and the titanium layer.

* * * * *